(12) United States Patent
Kaji

(10) Patent No.: US 12,177,993 B2
(45) Date of Patent: Dec. 24, 2024

(54) MODULAR AND CONFIGURABLE ELECTRICAL DEVICE GROUP

(71) Applicant: SELEC CONTROLS PRIVATE LIMITED, Mumbai (IN)

(72) Inventor: Samir Kaji, Mumbai (IN)

( * ) Notice: Subject to any disclaimer, the term of this patent is extended or adjusted under 35 U.S.C. 154(b) by 451 days.

(21) Appl. No.: 17/628,560

(22) PCT Filed: Feb. 14, 2020

(86) PCT No.: PCT/IN2020/050145
§ 371 (c)(1),
(2) Date: Feb. 16, 2022

(87) PCT Pub. No.: WO2021/137248
PCT Pub. Date: Jul. 8, 2021

(65) Prior Publication Data
US 2022/0287192 A1    Sep. 8, 2022

(30) Foreign Application Priority Data
Jan. 1, 2020   (IN) .............................. 202021000001

(51) Int. Cl.
*H05K 5/00* (2006.01)
*H05K 5/02* (2006.01)

(52) U.S. Cl.
CPC ......... *H05K 5/0217* (2013.01); *H05K 5/0017* (2013.01)

(58) Field of Classification Search
CPC ........................... H05K 5/0217; H05K 5/0017
USPC ......................................... 361/730, 728, 737
See application file for complete search history.

(56) References Cited

U.S. PATENT DOCUMENTS

| 5,302,136 A | 4/1994 | St. Germain et al. |
| 2006/0136622 A1* | 6/2006 | Rouvelin ............. H05K 7/1432 710/62 |
| 2012/0043378 A1* | 2/2012 | Vazach ............... G06F 9/44505 235/375 |

FOREIGN PATENT DOCUMENTS

| KR | 19990035837 | 9/1999 |
| WO | 1998018183 | 4/1998 |
| WO | 2000041273 | 7/2000 |
| WO | 2002007268 | 1/2002 |
| WO | 2003067716 | 8/2003 |
| WO | 2010051972 | 5/2010 |

(Continued)

*Primary Examiner* — Hung S. Bui
(74) *Attorney, Agent, or Firm* — Ifica D. Mehra

(57) ABSTRACT

A modular and configurable electrical device group 10 for measurement, control and display, comprising a first sub-group 11 having a base mountable enclosure unit 21, and a second sub-group 12 having a neck mountable enclosure unit 22, together with a programmable computing receptacle assembly 390, a plurality of function modules 300, a display module 350 and optionally a battery module 380; each member of the group 10 being an independently configurable application specific electrical control device, or as a slave or a master, or in combination to another member; the function module 300 may be an add-on function module 300A, and the display module 350 may be an add-on display module 350A, the function modules 300 mounted with a precisely engaging electrical arrangement till a defined engagement dimension, the function module 300 and the display module 350 securely removed, the display module 350 may have no display component.

18 Claims, 37 Drawing Sheets

(56) References Cited

FOREIGN PATENT DOCUMENTS

| | | |
|---|---|---|
| WO | 2013087486 | 6/2013 |
| WO | 2018220180 | 12/2018 |

\* cited by examiner

11

350A

MODULAR AND CONFIGURABLE ELECTRICAL DEVICE GROUP

FIELD OF THE INVENTION

The present invention relates to electrical devices, particularly modular electric devices, and more particularly modular electric devices deployed for controls and are configurable for control functions.

BACKGROUND OF THE INVENTION

Electrical devices deployed for measurement, protection and control are in abundance since quite some time and at present times. Progressively, the functions that such electrical devices can perform are exponentially increasing.

Let us understand this aspect with a temperature scanner, which is a relatively simple and one of the several possible illustrative products. Temperature Scanners generally monitor temperature of more than one point in a process. Through a configured program, temperature of each point is scanned in rotation and displayed. Optionally, either a common display with separate channel, or a zone indication control action is provided as programmed. Other options such as Printer Interface are provided as required. Temperature settings are done either by keypad or by set of thumb wheel switches. Scan time is settable between 0.1 sec per channel to 8.99 sec per channel, with a default setting of say 1 see. Through a Skip function, a particular Channel function is not scanned. The temperature scanner unit is housed in a suitable DIN standard cabinet. Such units are obviously suitable for a fixed group of inputs and outputs.

There are uncounted such devices deployed in any industrial process which require any and many of the following illustrative inputs/outputs:

1 or 2 or 4 or 6 or more digital inputs, 5 to 30V PNP type or NPN type, with or without Isolation, Response time <1 ms or suitable for up to 5 KHz, or higher frequency response; and or 1 or 2 or 3 or 4 relay Outputs, SPST or SPDT, 5A @ 250V (Resistive), Electrical life of the order of 1,00,000 operations and or Mechanical life of the order of 20,00,000 operations; and or 1 or 2 or 3 or 4 or more Transistor Output—24 VDC, 100 mA or higher, PNP or NPN, Short circuit protected, some or all of the Transistor Outputs be configured as Fast Outputs up to 5 KHz, or higher frequency response; and or 1 or 2 or 3 or 4 or more channel Analog Temperature input—PTC and or NTC and or RTD or any other type, of specified Accuracy and or conversion time; and or 1 or more channel Analog input, −1V to 10V or more, and or 0 to 20 mA or more, and or 4 to 20 mA, of specified accuracy and or conversion time; and or 1 or 2 or more channel Analog Output, 0 to 10V or more and or 0 to 20 mA or more, and or 4 to 20 mA, of specified accuracy and or conversion time; and or 1 or more channel Load Cell Input for weighing application; and or Customized card for mixed I/O (like 1DI, 1AI-TC or 1FI, 1FO etc.), special function input/output, user defined I/O card etc.; and or AC inputs 1 to 3 phase—voltage & current; and or Current transformer's AC current inputs; and or Any power or control or measurement or display input; and or Data-logging with requisite memory with SPI port communication, real-time clock and battery; and in requisite mounting provision including flush mounting and or projection mounting !

It is clear that above options amount to a large number of physically different products with even larger number of configuration possibilities.

There are higher end PLCs known, however they fail to meet this requirement economically. Also, such products are bulkier. Present invention addresses this pertinent industrial requirement.

OBJECTIVES

The objective is to invent a group of electrical devices that are suitable for accommodating different combinations of function modules namely input modules, output modules, display modules, battery modules, temperature modules and so on.

Another objective is to invent a group of electrical devices that are configurable up to a smallest possible combination of 1 input or output.

Yet another objective is to invent a group of electrical devices that are mountable on a door or a base or a combination.

Yet another objective is to invent a group of electrical devices that are used individually as well as in combination.

Yet another objective is to invent a group of electrical devices which allow insertion and removal of modules in consonance with its mounting.

Yet another objective is to invent a group of electrical devices which ensure fail proof connection and disconnection of electrical circuit of function modules.

Yet another objective is to invent a group of electrical devices that have common critical modular parts.

Yet another objective is to invent a group of electrical devices that have secure placement of critical modular parts.

Yet another objective is to invent a group of electrical devices that have modular parts mountable within or without the group of electrical devices.

SUMMARY OF THE INVENTION

Present invention is a group of electrical devices comprising a first sub-group of electrical devices and a second sub-group of electrical devices. Each member of electrical device of the first sub-group comprises a base mountable enclosure unit, a programmable computing receptacle assembly and a plurality of function modules. Each member of electrical device of the second sub-group comprises a neck mountable enclosure unit, a programmable computing receptacle assembly and a plurality of function modules. The function modules cater to different application specific functions, for each function the electronic circuitry being different, architectured in a common mechanical design. Each member of electrical device has a display module and optionally a battery module. Each member of electrical device of the first sub-group and the second sub-group is an independently configurable application specific electrical control device, as a slave or a master, in combination to a plurality of members of electrical device of the first sub-group and the second sub-group of electrical devices.

The process of assembling the member of electrical device of the first sub-group comprises the steps of selecting the function specific function modules and the display module, inserting a programmable computing receptacle assembly in a front unit, disposing a rear unit on the front unit, inserting a function circuit assembly of the function module in a pair of minor parallel tracks of a functional unit receiver arrangement, pushing in a fixation cap till a frontal locking means gets trapped in a frontal locking slot on the front unit, and simultaneously, a constraining female projection of the first bridge engaging with a constraining male projections of the front unit, and a locating female orifice of a second bridge engulfing a locating male projections on the front unit; and thus ensuring that a set of plug-in male electrical connectors of the function module precisely engages till a defined engagement dimension, with a corresponding set of plug-in female electrical connector on the programmable computing receptacle assembly; inserting a display module via a display circuit assembly of the display module from the display module receiving opening of the front unit in an engaging orientation, pushing in the display module till a projection of the display module engager gets trapped in a locking slots of the front unit, and at this instance the plug-in female electrical connector of the display module precisely engaging till a defined engagement dimension with a corresponding set of plug-in male electrical connector on the programmable computing receptacle assembly; inserting the battery module in a longitudinal through slot of battery module receiver arrangement of the front unit after engaging the guiding projection of the battery carrier in the extension slot, thus ensuring that a polarized module cover is aligning with a polarized seat, pushing the polarized module cover of the battery carrier till a click-fitting provisions "click" into a click-locking slot; thus ensuring that a cantilever arm is supporting a commensurate battery cell while the first contact surface and the second contact surface makes an electrical contact with the battery cell connector on the programmable computing receptacle assembly with a requisite contact pressure.

Removing or replacing the display module of the member of electrical device of the first sub-group of electrical devices involves holding from the finger receptacle of the display panel by a thumb and a finger, or a commensurate tool, and pressing inward the flexing cantilever of the display panel, so the projection of the display module engager gets free from the locking slots of the front unit, and the display module is pullable; removing or replacing the function module involves untrapping the frontal locking means of the function module, while simultaneously steering the function module out of the front unit, thus also disengaging the constraining female projection of the first bridge from the constraining male projections of the front unit, and the locating female orifice of the second bridge from the locating male projections on the front unit.

The untrapping of the frontal locking means is by a fine edge screw driver or an equivalent sharp tool. For situations where the removing or replacing the function module is a supervisory function, the fixation cap has a pair of safety slots, and the untrapping is by a fork type screw driver. As yet another embodiment, the untrapping is by a fork type tool with an untrapping profile complementary to a safety profile provided on the fixation cap of the function module.

The process of assembling the member of electrical device of the second sub-group of electrical devices, removing or replacing modules is comparable to that of the first sub-group.

As an important variation, the function module and the display module are mountable outside the base mountable enclosure unit and the neck mountable enclosure unit, wherein the function module is an add-on function module with a base mounting arrangement, or mountable on and around the base mountable enclosure unit, or on and around the neck mountable enclosure unit. The add-on function module is electrically connected either through a communication link or through a plug-on arrangement. The present invention has innumerable such possibilities.

The modular and configurable electrical device group as per present invention is branded as

MBRX

BRIEF DESCRIPTION OF DRAWINGS

FIG. 12A is a perspective view of a function module, while

FIG. 13A is a perspective view of a display circuit assembly and a display panel of a display module, while

FIG. 15A is a perspective view of a programmable computing receptacle assembly, while

FIG. 27A is a perspective view of an add-on function module, while

DETAILED DESCRIPTION

Present invention is described with the help of accompanying drawings. The invention has a wide application, and the explanation and illustrations should not be construed to limit the invention in any manner whatsoever.

Figure 1:
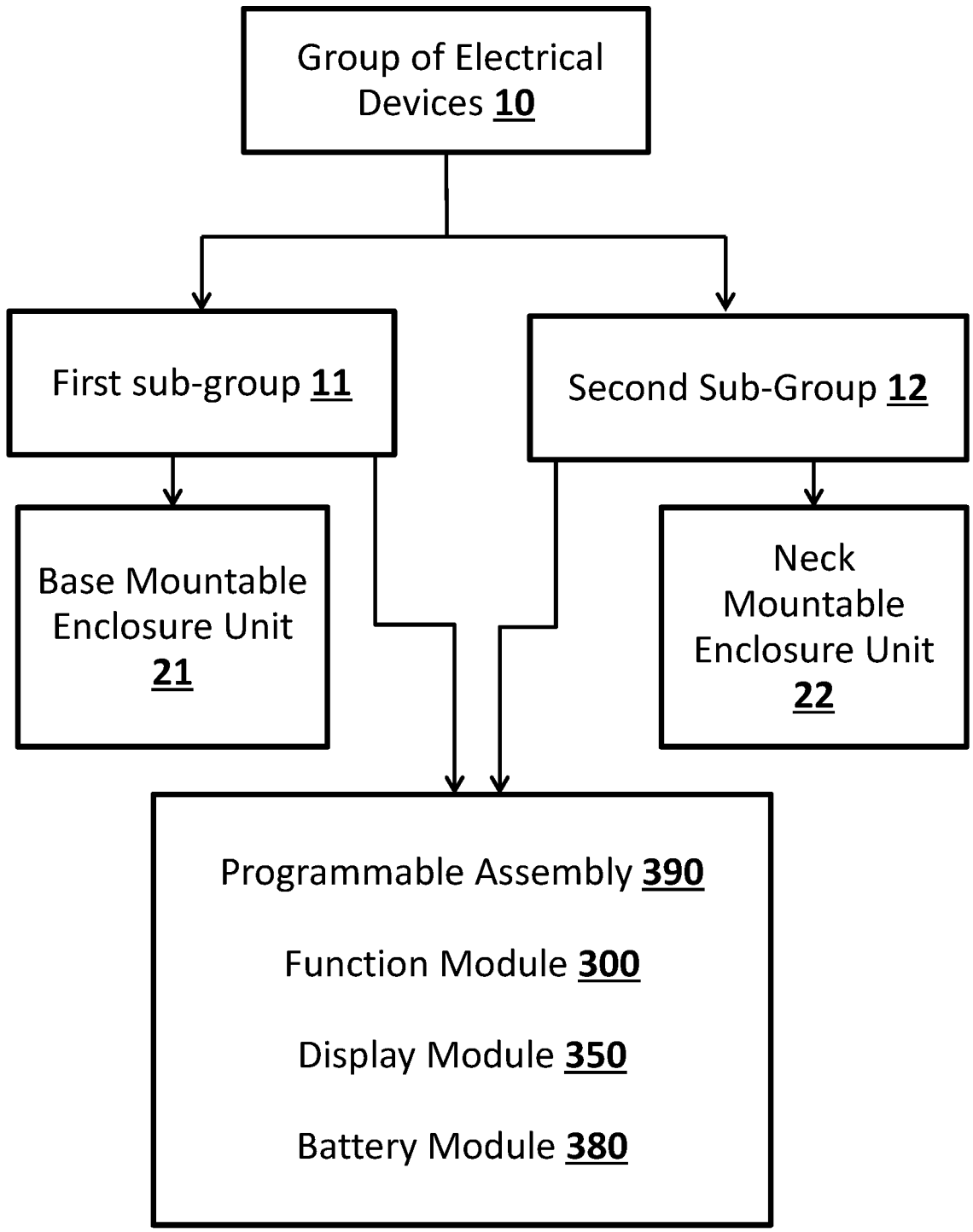
FIG. 1 is a block diagram giving constituents of a group of electrical devices as per present invention.

FIG. 1, the present invention is a group of electrical devices 10. The group comprises a first sub-group of electrical devices 11 and a second sub-group of electrical devices 12.

Figure 2:
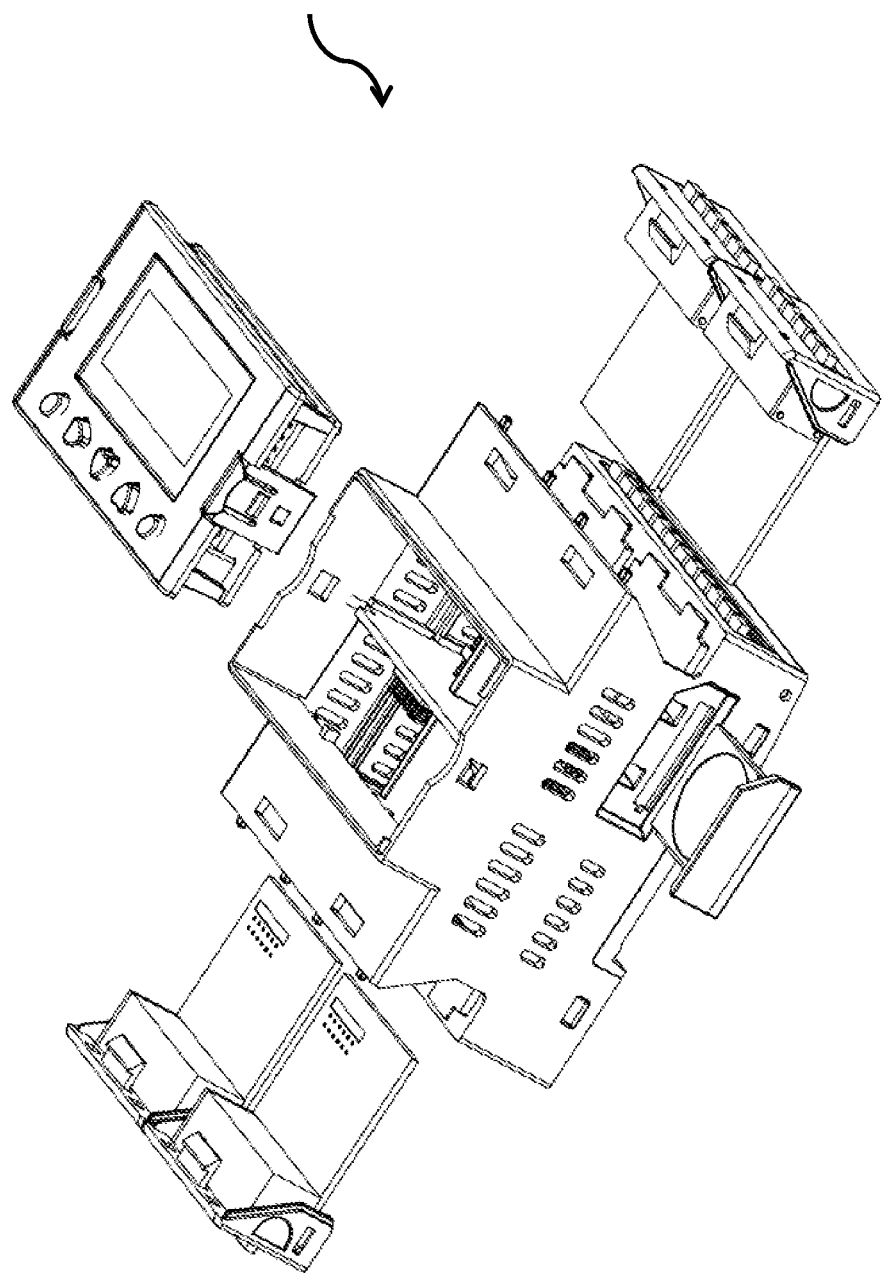
FIG. 2 is an exploded view of one of the members of a first sub-group.

FIGS. 1 and 2, each member of electrical device of the first sub-group 11 comprises a base mountable enclosure unit 21, a programmable computing receptacle assembly 390 and a plurality of function modules 300. As a preferred embodiment, a first member of electrical device of the first sub-group 11 accommodates at least one function module 300, a second member of electrical device of the first sub-group 11 accommodates at least four function modules 300, a third member of electrical device of the first sub-group 11 accommodates at least six function modules 300, and so on.

A number of function modules prescribed in the preferred embodiments in the first sub-group 11 above are merely illustrative and based on a preferred physical size, and are not limited by concept of the present invention, which is capable of supporting any other combination of function module count.

Figure 3:
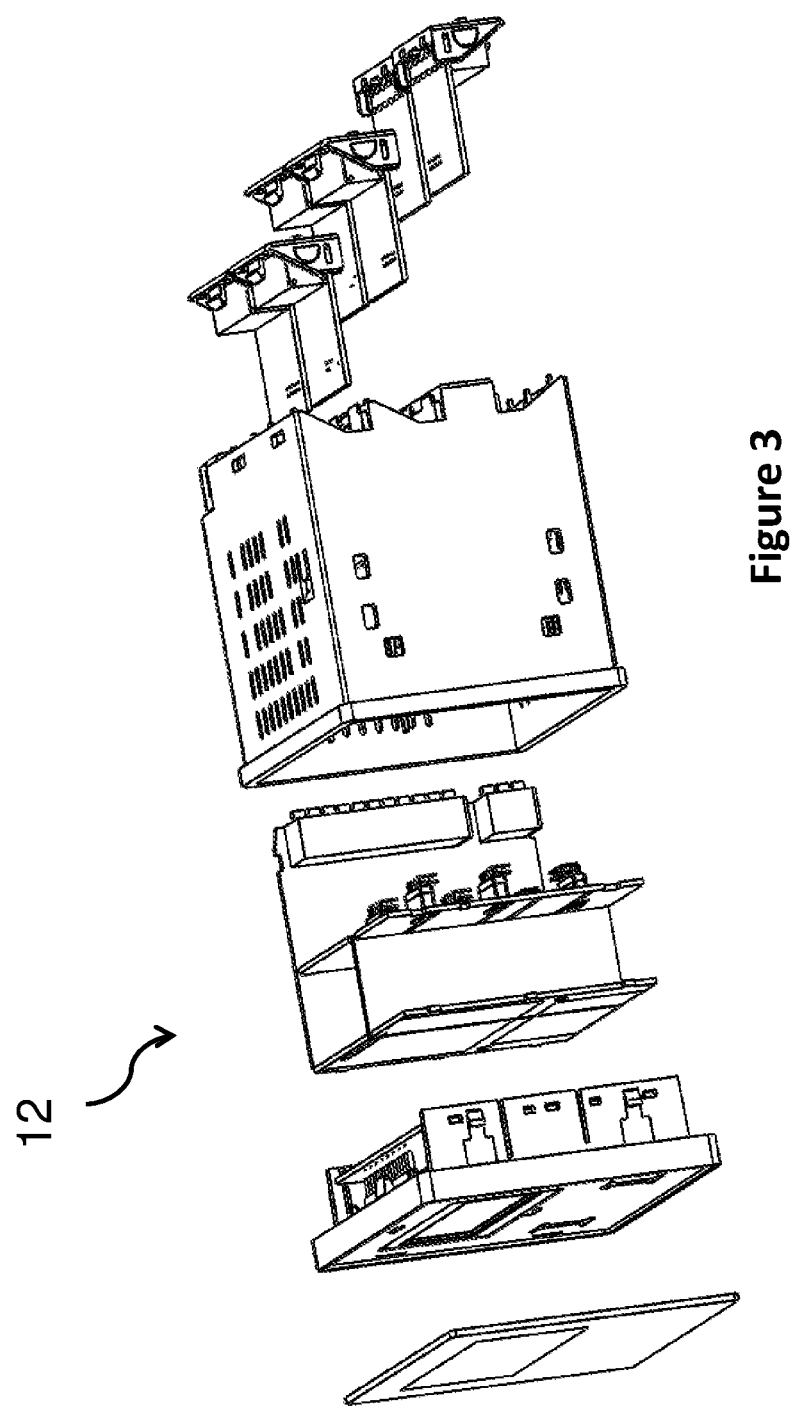
FIG. 3 is an exploded view of one of the members of a second sub-group.

FIGS. 1 and 3, each member of electrical device of the second sub-group 12 comprises a neck mountable enclosure unit 22, a programmable computing receptacle assembly 390 and a plurality of function modules 300. As a preferred embodiment, a first member of electrical device of the second sub-group 12 accommodates at least one function module 300, a second member of electrical device of the second sub-group 12 accommodates at least two function modules 300, a third member of electrical device of the second sub-group 12 accommodates at least six function modules 300, and so on.

A number of function modules prescribed in the preferred embodiments in the second sub-group 12 above are merely illustrative and based on a preferred physical size, and are not limited by concept of the present invention, which is capable of supporting any other combination of function module count.

Function modules 300 cater to different application specific functions, a non-exhaustive list being:
digital inputs of various types, with or without Isolation, of different response times
relay outputs, with different mechanical and electrical ratings
transistor outputs, of different ratings, with different protections and output speed
analog temperature input—PTC and or NTC and or RTD and or any other type, of specified Accuracy and or conversion time
analog input, −1V to 10V or more, and or 0 to 20 mA or more, and or 4 to 20 mA and or more, of specified accuracy and or conversion time
analog output, 0 to 10V or more and or 0 to 20 mA or more, and or 4 to 20 mA and or more, of specified accuracy and or conversion time
load cell Input for weighing application
data-logging For each function, the electronic circuitry is different, architectured in a common mechanical design, described later.

Each member of electrical device has a display module 350 and optionally a battery module 380. The display module 350 has the possibility of having a variety of sizes and kind of electrical display component and one of the possibilities is having no display component.

Each member of electrical device of the first sub-group 11 and the second sub-group 12 is an independently configurable application specific electrical control device.

Each member of electrical device of the first sub-group 11 and the second sub-group 12 is a configurable application specific electrical control device as a slave or a master, in combination to a plurality of members of electrical device of the first sub-group 11 and the second sub-group of electrical devices 12. Illustratively, an electrical function requiring an electrical control device with eight function modules 300, a display module 350 and a battery module 380 is configurable by deploying Two or more members of electrical devices of the first sub group 11, in combination; or
Two or more members of electrical devices of the second sub group 12, in combination; or
Two or more members of electrical devices of the first sub group 11 and the second sub-group 12, in combination;

resultantly, a most optimum equipment layout of electrical devices on a base and a panel door of any electrical cubicle is facilitated. The display module 350 and the function module 300 are integrable within or without the member of electrical device of the first sub-group 11 and the second sub-group 12.

A preferred embodiment of a member of electrical devices of a first sub-group 11 and a second sub-group 12 is described in detail.

Figure 4:
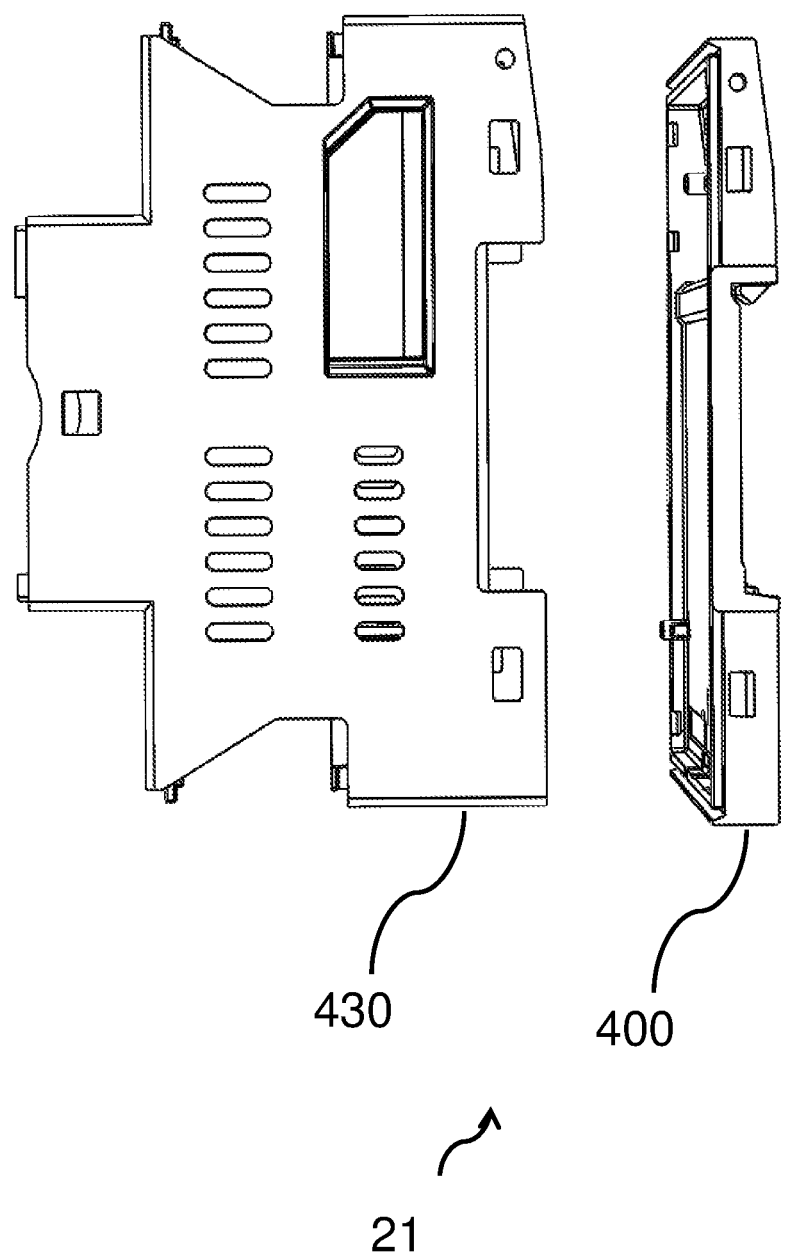
FIG. 4 is an exploded side view of rear unit of a base mountable enclosure unit.

FIG. 4, the base mountable enclosure unit 21 of each member of electrical device of the first sub-group 11 comprises a rear unit 400 and a front unit 430.

Figure 5:
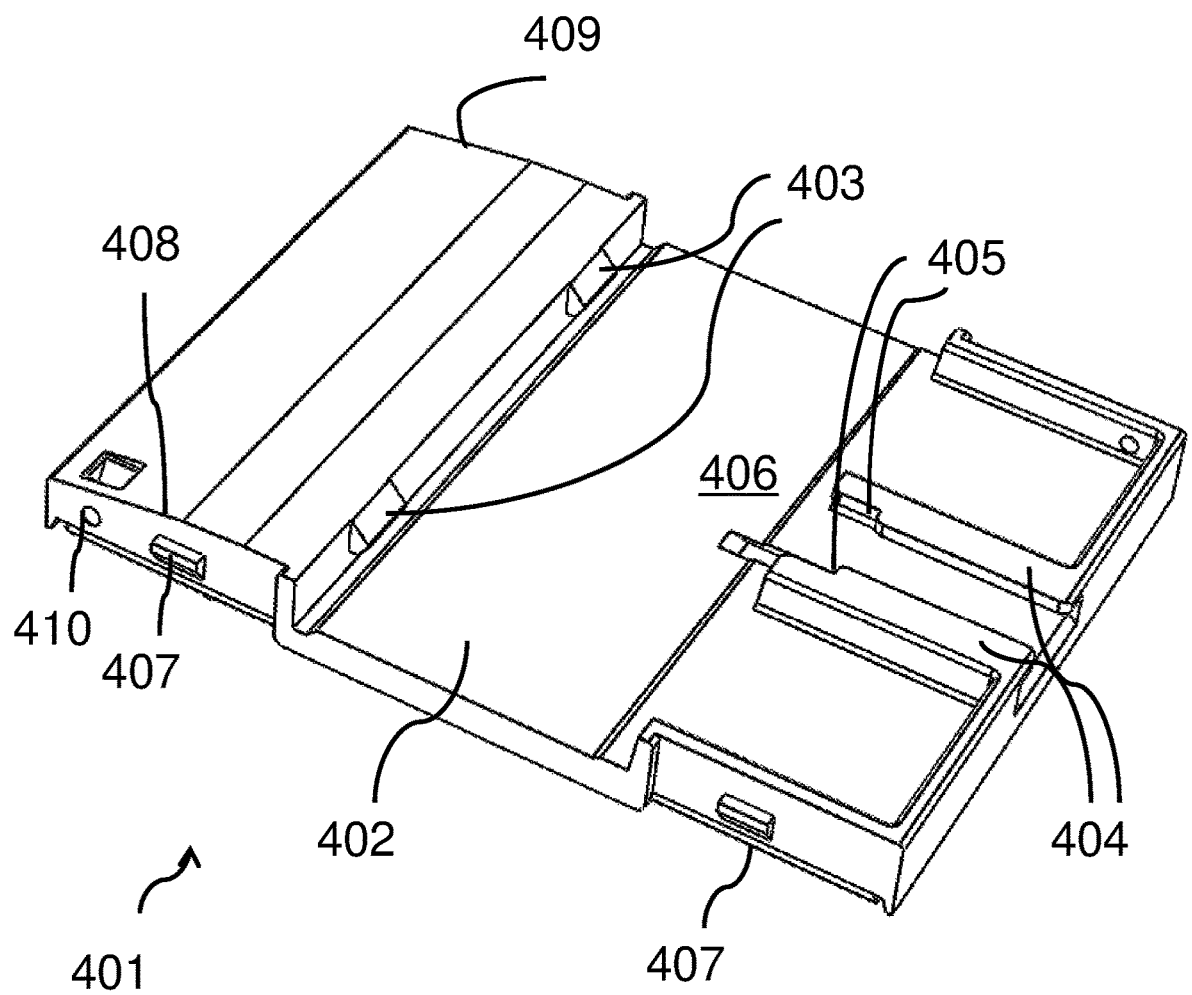
FIG. 5 is a generic view of a rear plate of the rear unit.
Figure 6:
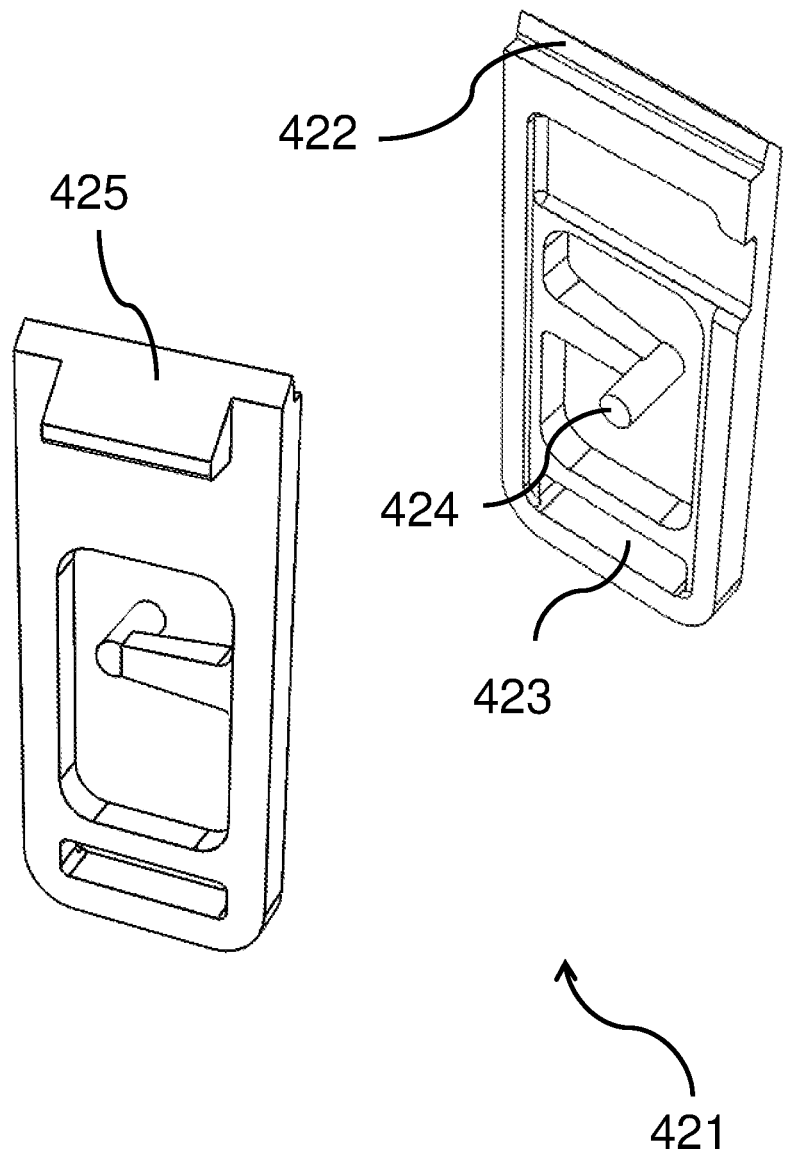
FIG. 6 is two generic views of a locking frame of the rear unit.

The rear unit 400 comprises a rear plate 401 (FIG. 5) and a locking frame 421 (FIG. 6).

FIG. 5, the rear plate 401 has an open channel 402 with a plurality of static projections 403. The rear plate 401 also has a pair of constrainers 404, each constrainer having a relief 405 at its inner end 406. The rear plate 401 has a plurality of engage-able projections 407. A left edge profile 408 and a right edge profile 409 is asymmetrical at its respective ends, while being mutually parallel. A sealing hole 410 is provided.

FIG. 6, the locking frame 421 has at least one dynamic support 422, an engagement window 423, and a cantilevered pin 424. The locking frame 421 is engaged within constrainers 404 from the inner end 406 such that the cantilevers pin 424 gets trapped in a compatible hole 411 provided in between the pair of constrainers 404 on the rear plate 401. With the locking frame 421 so assembled the rear unit 400 becomes suitable for mounting on a DIN rail, and can be disengaged when the locking frame 421 is pulled outwardly by leveraging with a screw driver in the engagement window 423. The locking frame 421 is pulled outwards with a pulling force till a constraining projection 425 is prevented from further movement at the end of the relief 405. The cantilevered pin 424 provides a springy action so the locking frame 421 retracts when the pulling force is removed.

Figure 7:
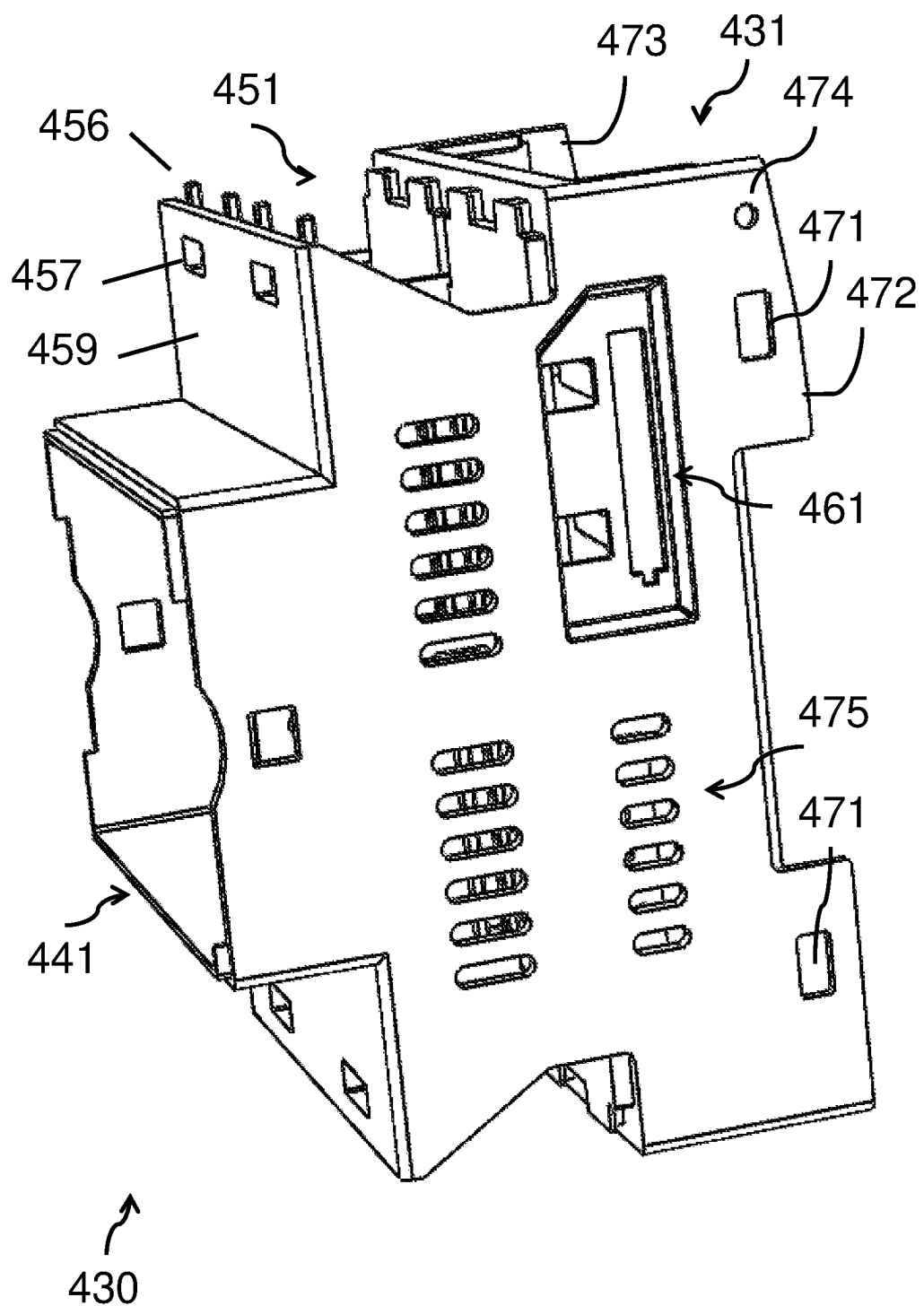
FIG. 7 is a perspective view of a front unit of the base mountable enclosure unit.

FIG. 7, the front unit 430 has a computing assembly receiver arrangement 431, a display module receiver arrangement 441, a plurality of functional unit receiver arrangement 451, at least a battery module receiver arrangement 461, a plurality of rear unit projections receiver openings 471. A left edge 472 and a right edge 473 is asymmetrical and matched with the rear unit 400. A matching sealing hole 474 is provided. There are a plurality of ventilation openings 475.

Figure 8:
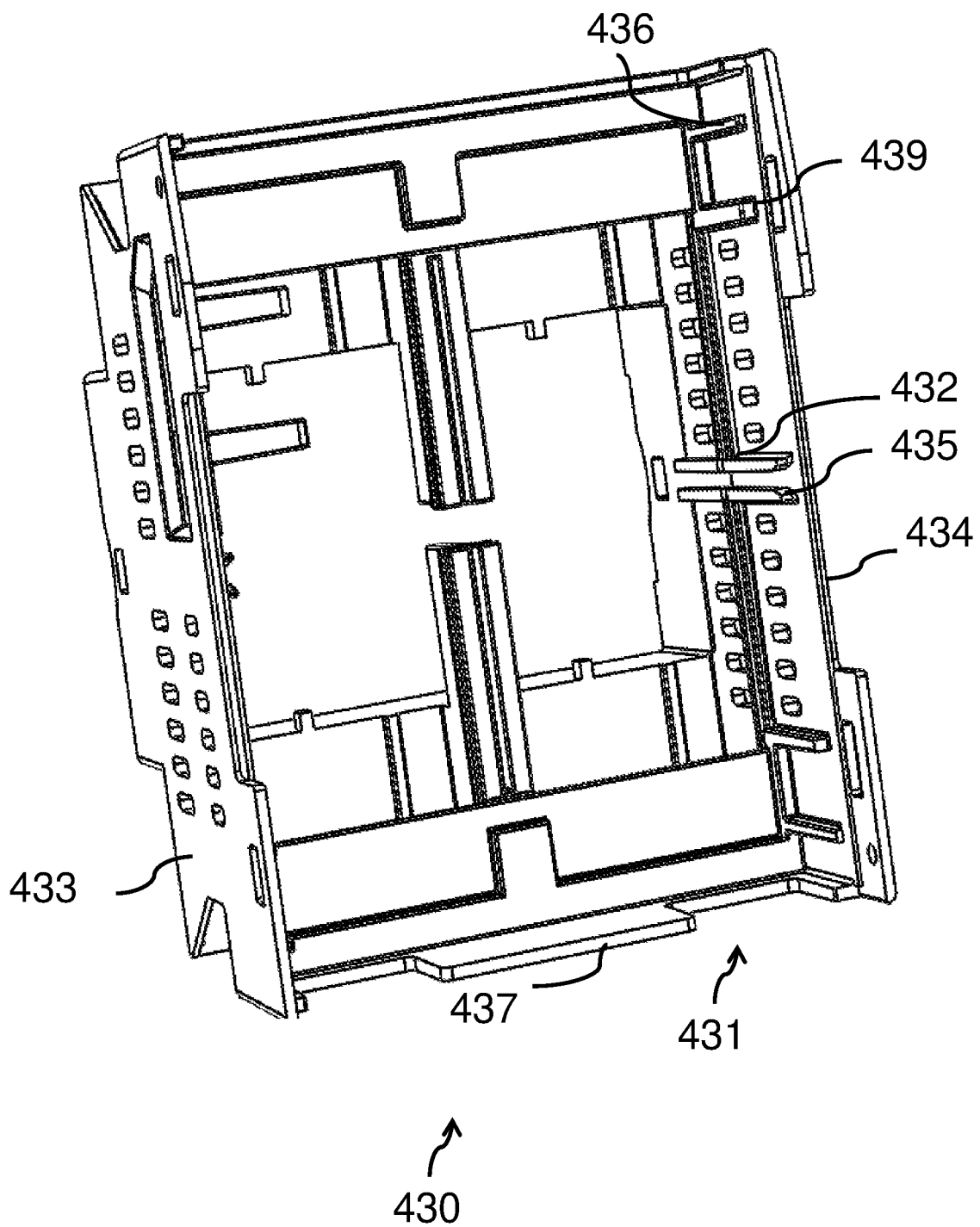
FIG. 8 is another perspective view of the front unit of the base mountable enclosure unit.

FIG. 8, in the preferred embodiment, the computing assembly receiver arrangement 431 has a pair of major parallel tracks 432 on an inside of a left wall 433 and a right wall 434 of the front unit 430. Each major parallel track 432 has a major entry chamfer 435. The left wall 433 and the right wall 434 also have a plurality of resting pads 439 and a plurality of locator pads 436. On a bottom on the front unit 430 there is an assembly constrainer 437.

Figure 9:
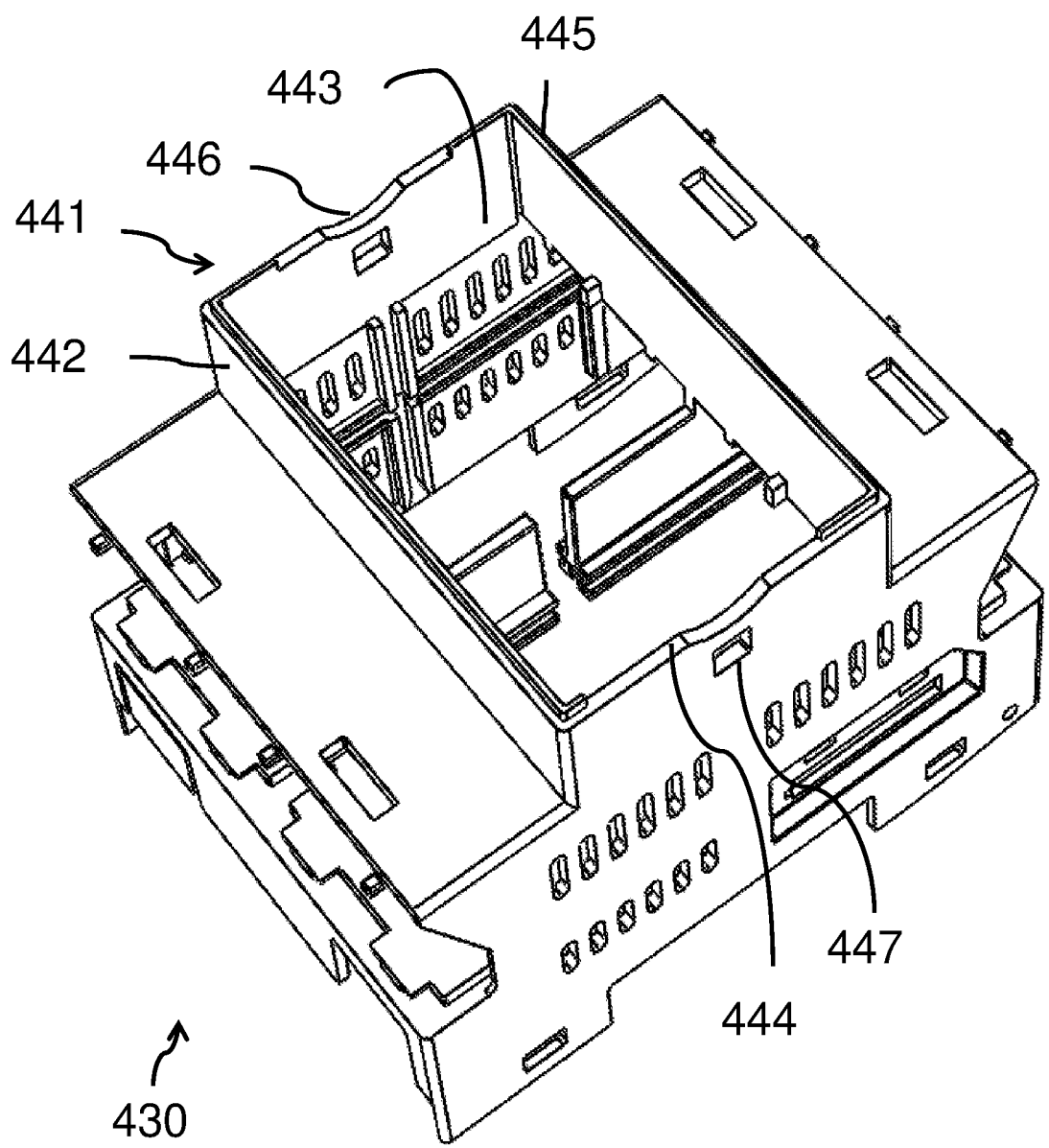
FIG. 9 is yet another perspective view of the front unit of the base mountable enclosure unit.

FIG. 9, the display module receiver arrangement 441 has a peripheral wall 442 around a display module receiving opening 443, a clear zone 444 on the peripheral wall 442, the peripheral wall 442 has a raised projection 445, a pair of finger reliefs 446 and at least two locking slots 447.

Figure 10:
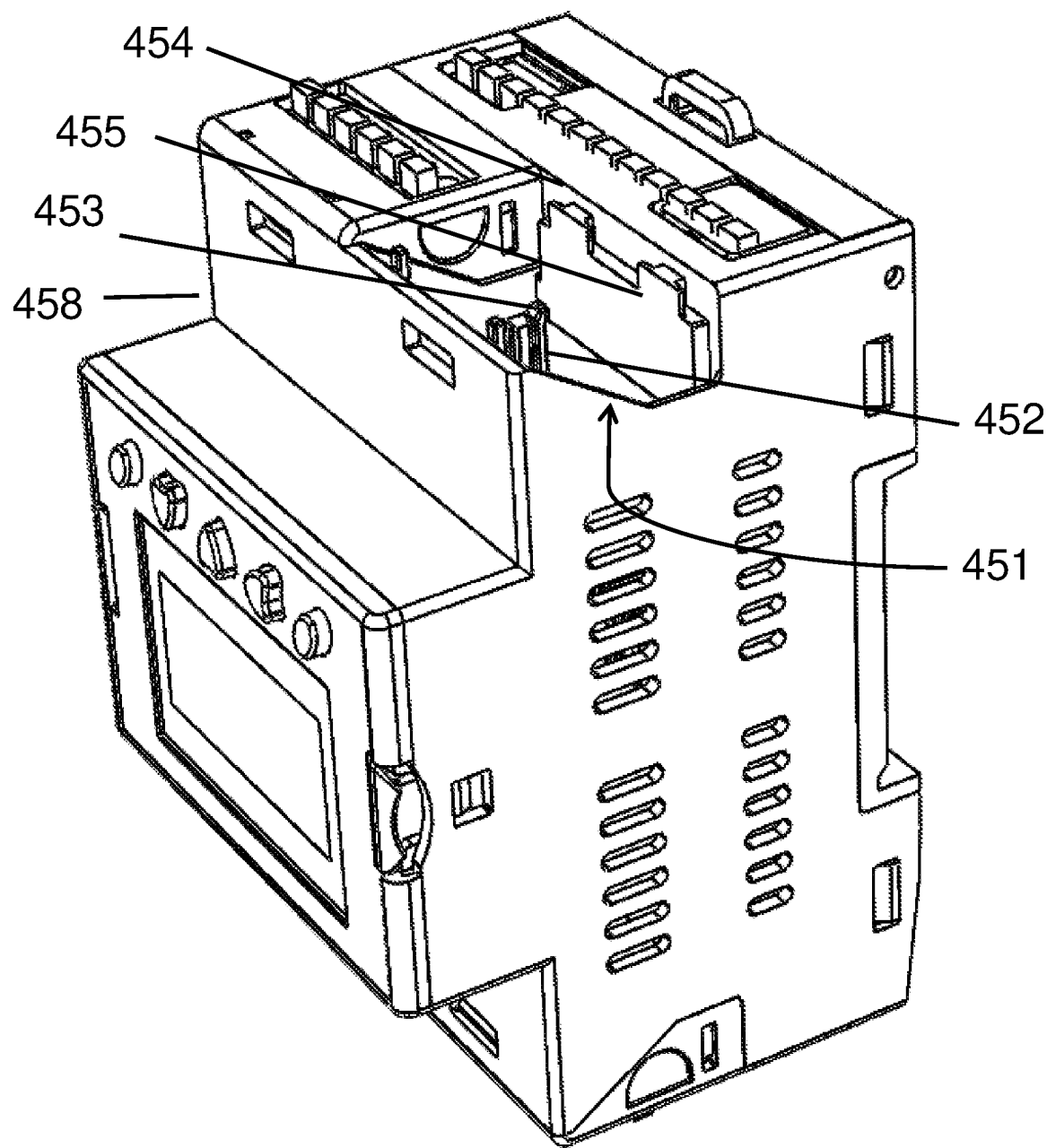
FIG. 10 is a generic view of one of the members of a first sub-group.

FIGS. 7 and 10, the functional unit receiver arrangement 451 has a pair of minor parallel tracks 452. Each minor parallel track 452 has a minor entry chamfer 453. A back wall 454 has at least one constraining male projection 455, a front side 458 of the front wall 459 has at least one locating male projection 456 and at least one frontal locking slot 457.

Figure 11A:
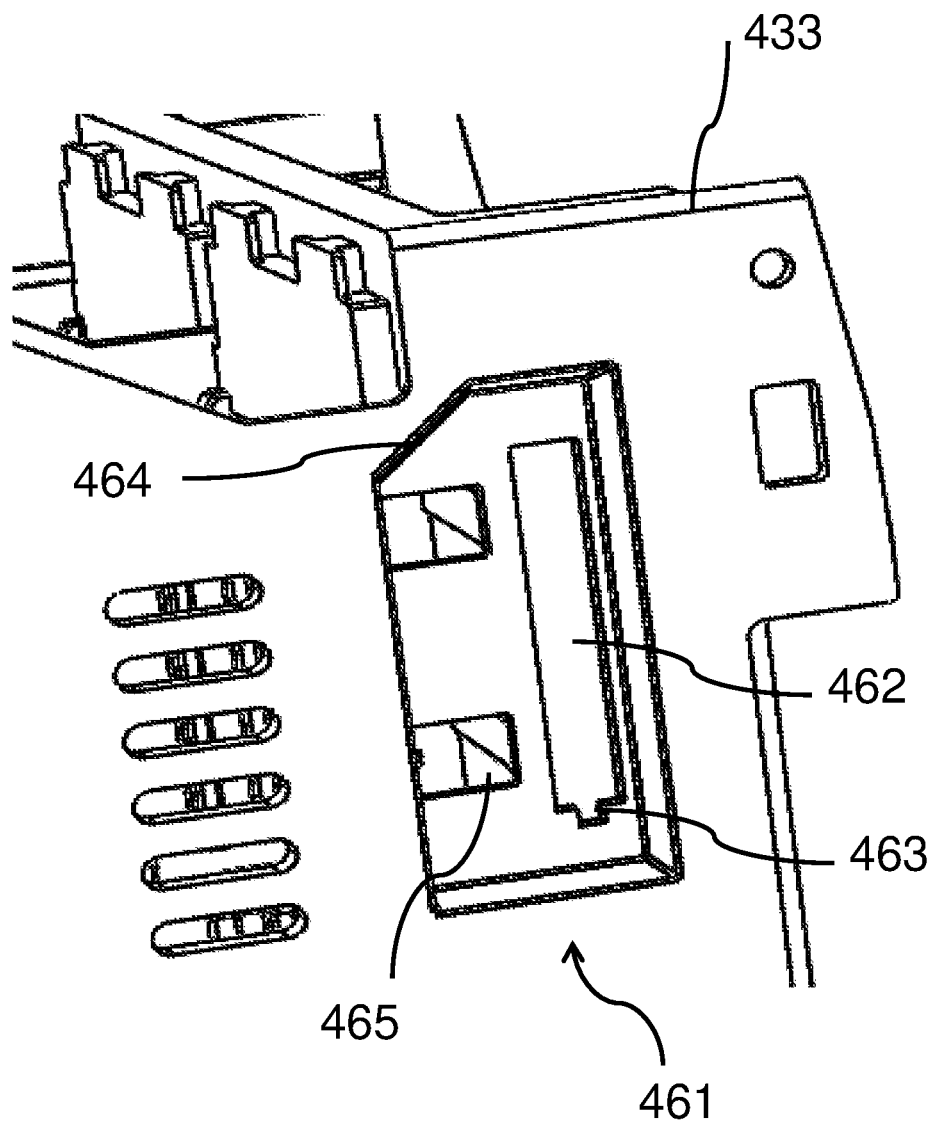
FIGS. 11A and 11B are partial perspective views of the front unit of the base mountable enclosure unit.
Figure 11B:
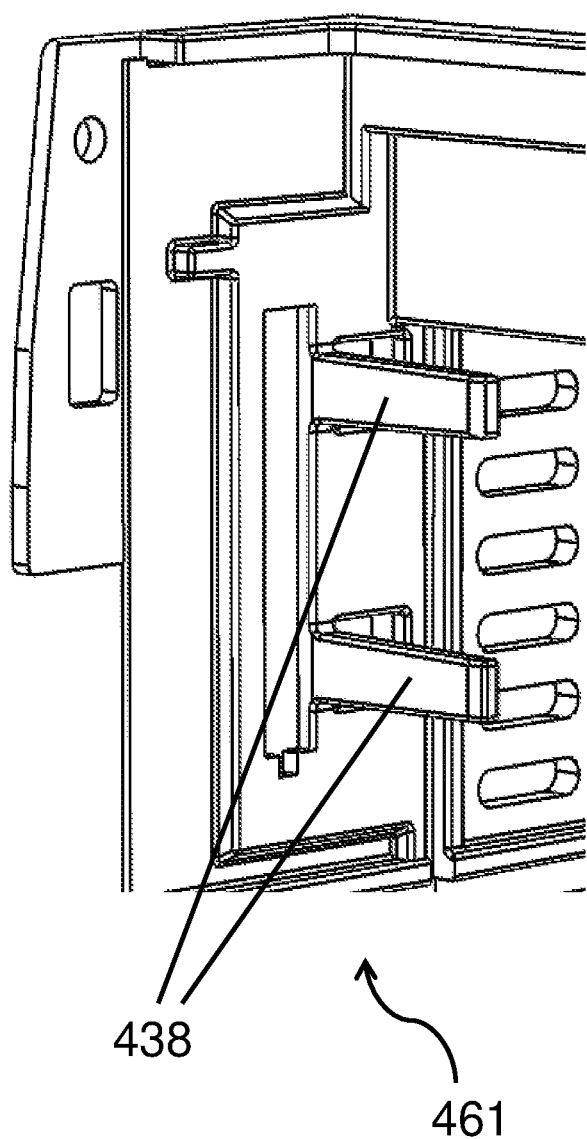

FIGS. 11A and 11B, the battery module receiver arrangement 461 has a longitudinal through slot 462 having at least an extension slot 463, and a polarized seat 464 on at least one of the left wall 433 and the right wall 434. There is a plurality of click-locking slots 465. On the opposite side of the left wall 433 and or the right wall 434 is at least one cantilever arm 438 at a defined distance from the longitudinal through slot 462.

Figure 12A:
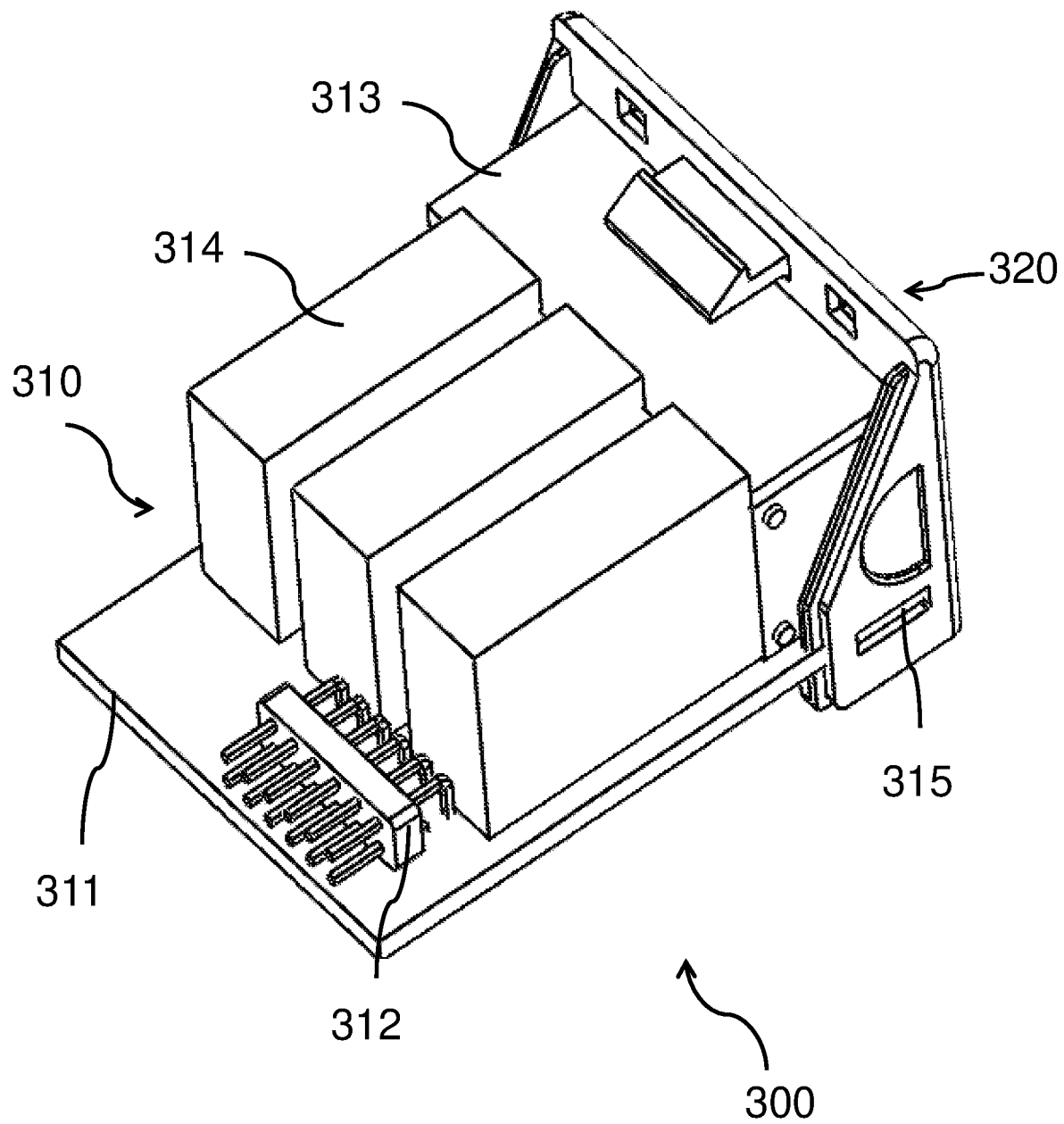
Figure 12B:
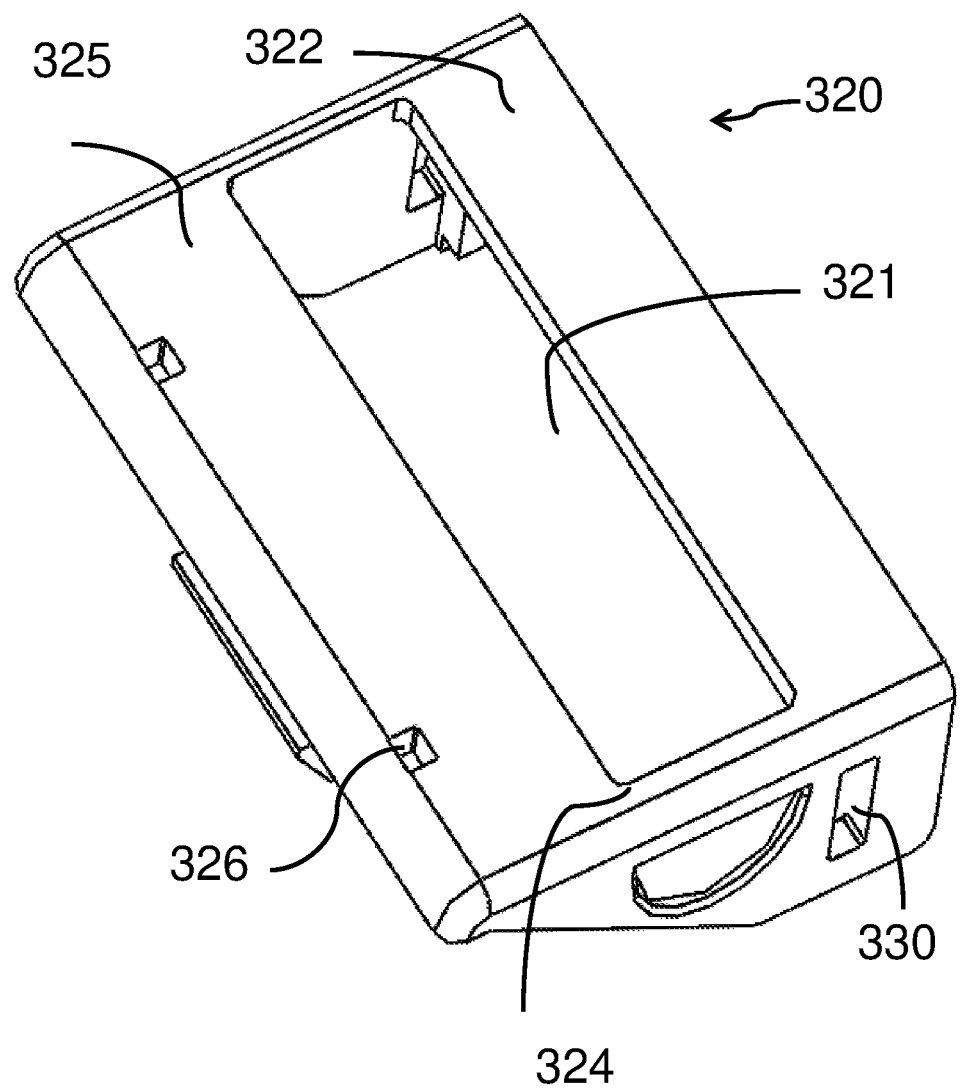
FIGS. 12B and 12C are perspective views of a fixation cap of the function module.
Figure 12C:
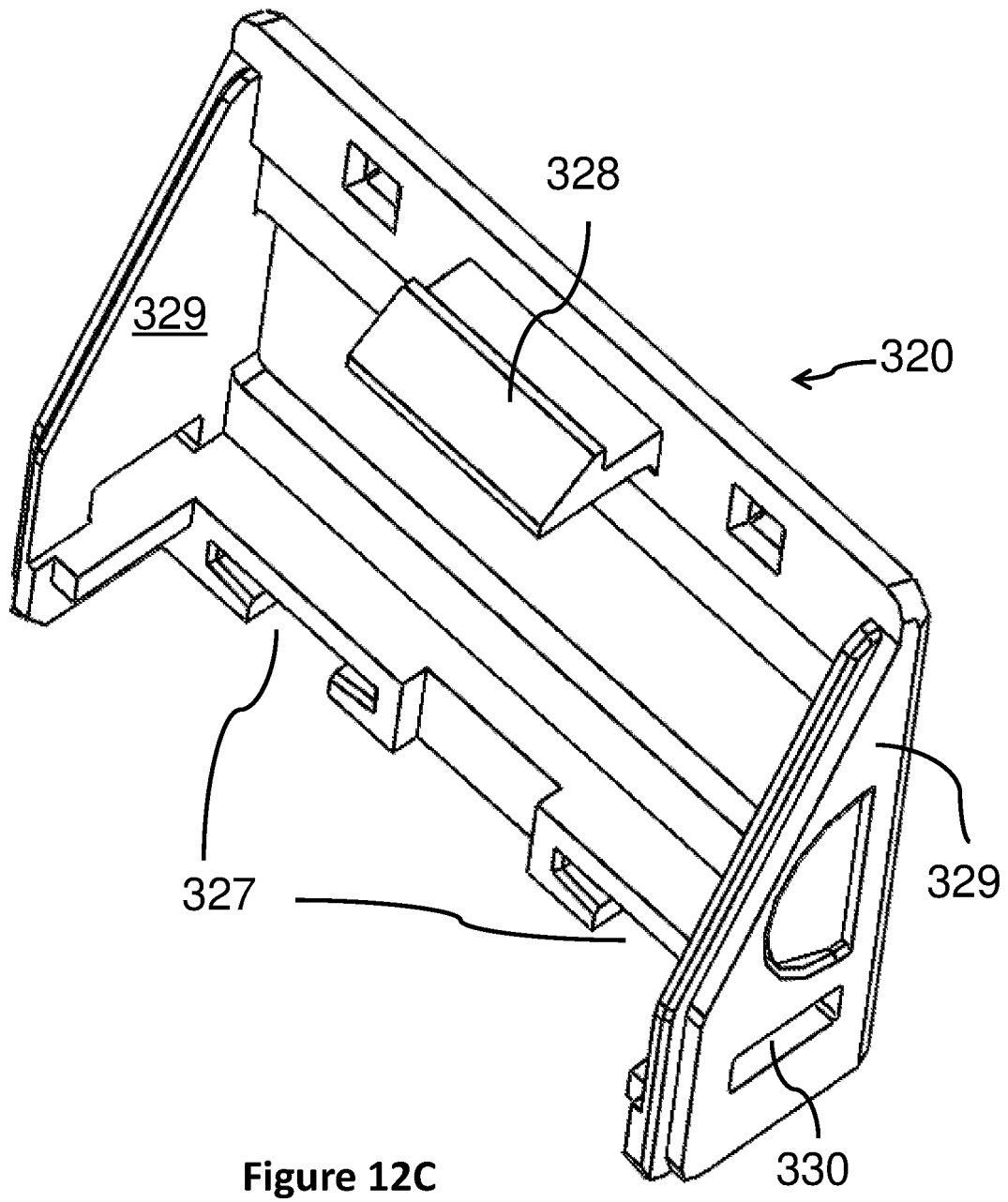

FIGS. 12A, 12B and 12C, the function module 300 comprises a function circuit assembly 310 and a fixation cap 320 disposed on the function circuit assembly 310.

A printed circuit board 311 of the function circuit assembly 310 has a set of plug-in male electrical connectors 312, a set of wire-able connectors 313 and a function specific electronic circuitry 314. The printed circuit board 311 has at least two ear projections 315.

The fixation cap 320 is made of an engineering plastic. The fixation cap 320 has a connector slot 321 on a bridging plane 324. A first bridge 325 of the bridging plane 324 has one or more constraining female projection 326, complement to the corresponding constraining male projection 455 on the front unit 430. A second bridge 322 of the bridging plane has one or more locating female orifice 327 complement to the corresponding locating male projection 456 on the front unit 430, and at least one frontal locking means 328 corresponding to the frontal locking slot 457 on the front unit 430. On either side of the bridging plane 324 is a wall 329 having an ear accommodator 330 complement to the ear projections 315 on the printed circuit board 311, for precise disposal of the fixation cap 320 on the function circuit assembly 310.

Figure 13A:
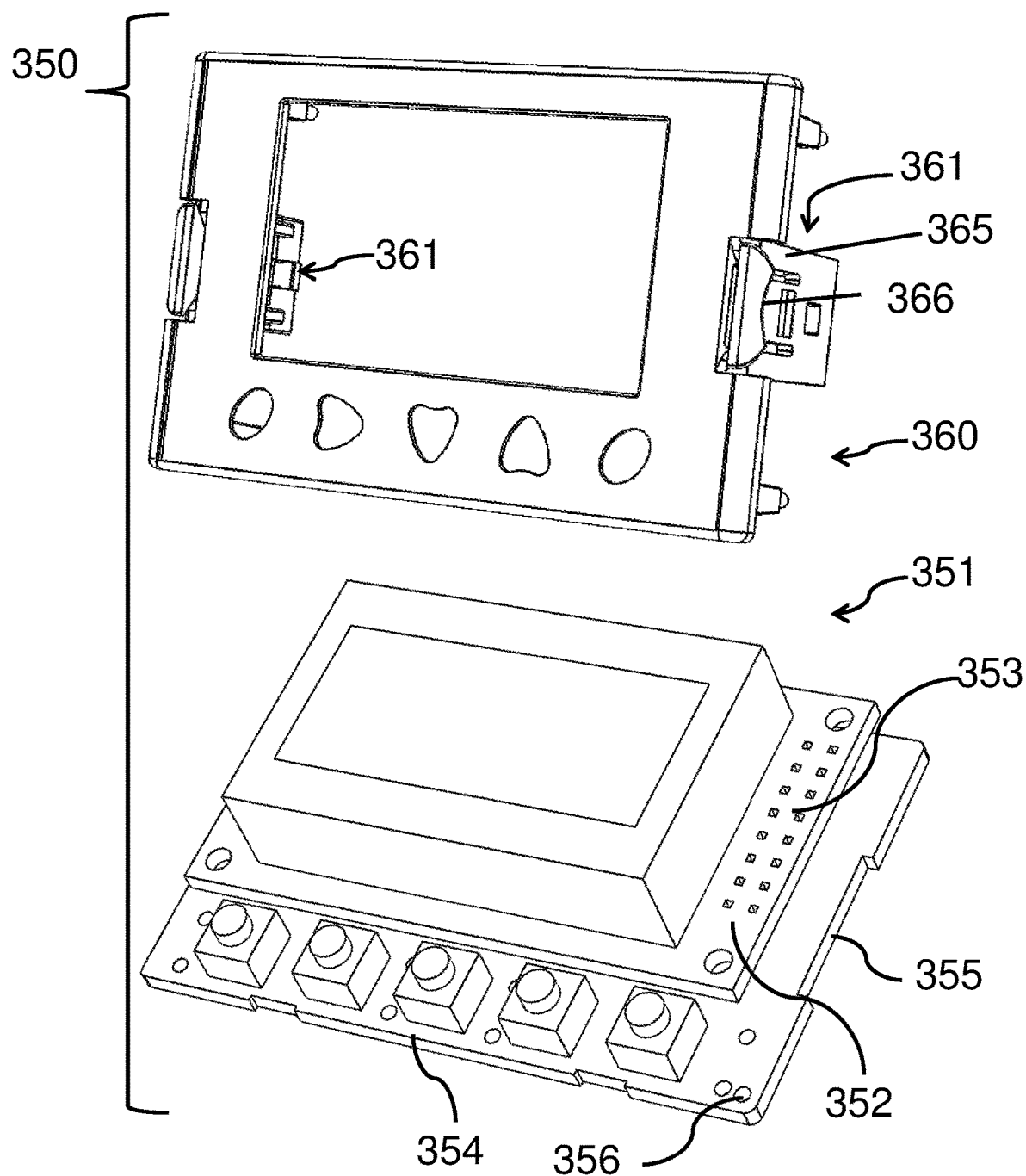
Figure 13B:
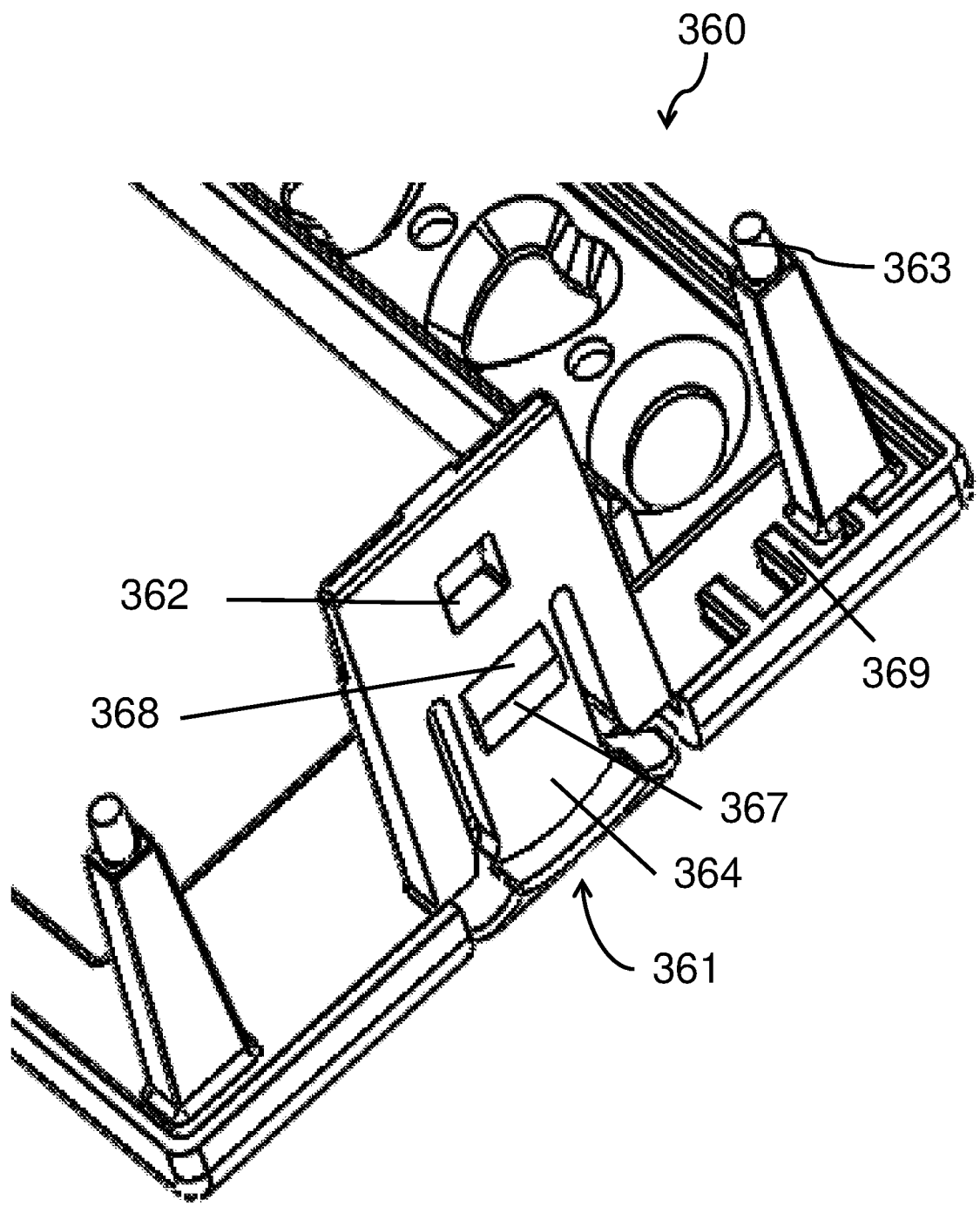
FIG. 13B is a partial perspective view of the display panel.

FIGS. 13A and 13B, the display module 350 comprises a display circuit assembly 351 and a display panel 360 disposed on the display circuit assembly 351.

A display board 352 of the display circuit assembly 351 has a set of plug-in female electrical connectors 353 and a display specific electronic circuitry 354. The display board 352 has a plurality of display panel locator holes 356 and at least two display panel engagers 355.

The display panel 360 is made of an engineering plastic. The display panel 360 has a pair of an integrated module managing means 361. The module managing means 361 comprises a display board carrier 362 in coordination with a plurality of display board stoppers 363, and a display module engager 364, the display board carrier 362 and the display module engager 364 are integrated as a single hanging construction. The display module engager 364 and the display board carrier 362, though constructed integratedly, the display module engager 364 and the display board carrier 362 operate independent of each other. The display module engager 364 comprises a flexing cantilever 365 with a finger receptacle 366 and has a projection 367. The projection 367 has an engaging taper 368. The display panel 360 has a plurality of display board stoppers 363, and an obstructing projection 369 on an inside 363. There are several embodiments of the display panel 360 according to electrical requirements.

The display panel 360, when disposed on the display circuit assembly 351, holds the display board 352 by the display board carriers 362 flexing and the display board 352 sitting on the display board carriers 362, once the display board stoppers 363 of the display panel 360 find the display panel locator holes 356 on the display board 352.

Figure 14A:
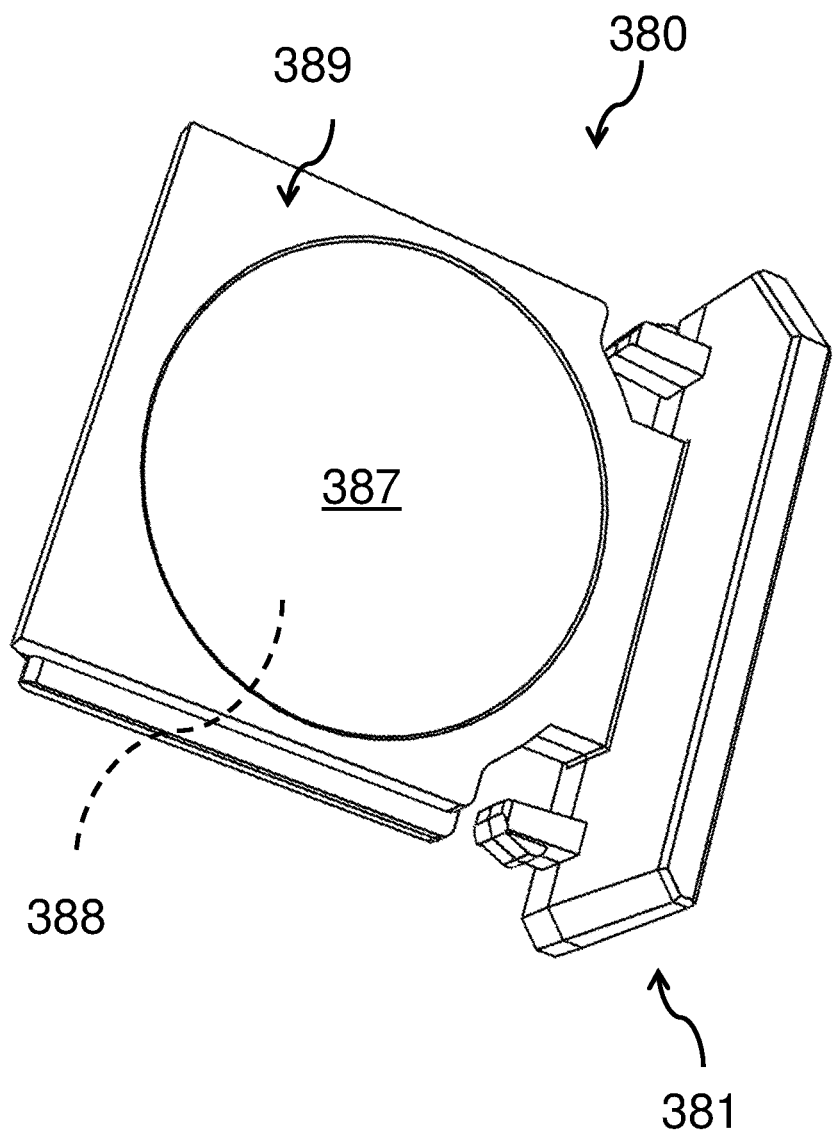
FIGS. 14A, 14B and 14C are different perspective view of two embodiments of a battery module.
Figure 14B:
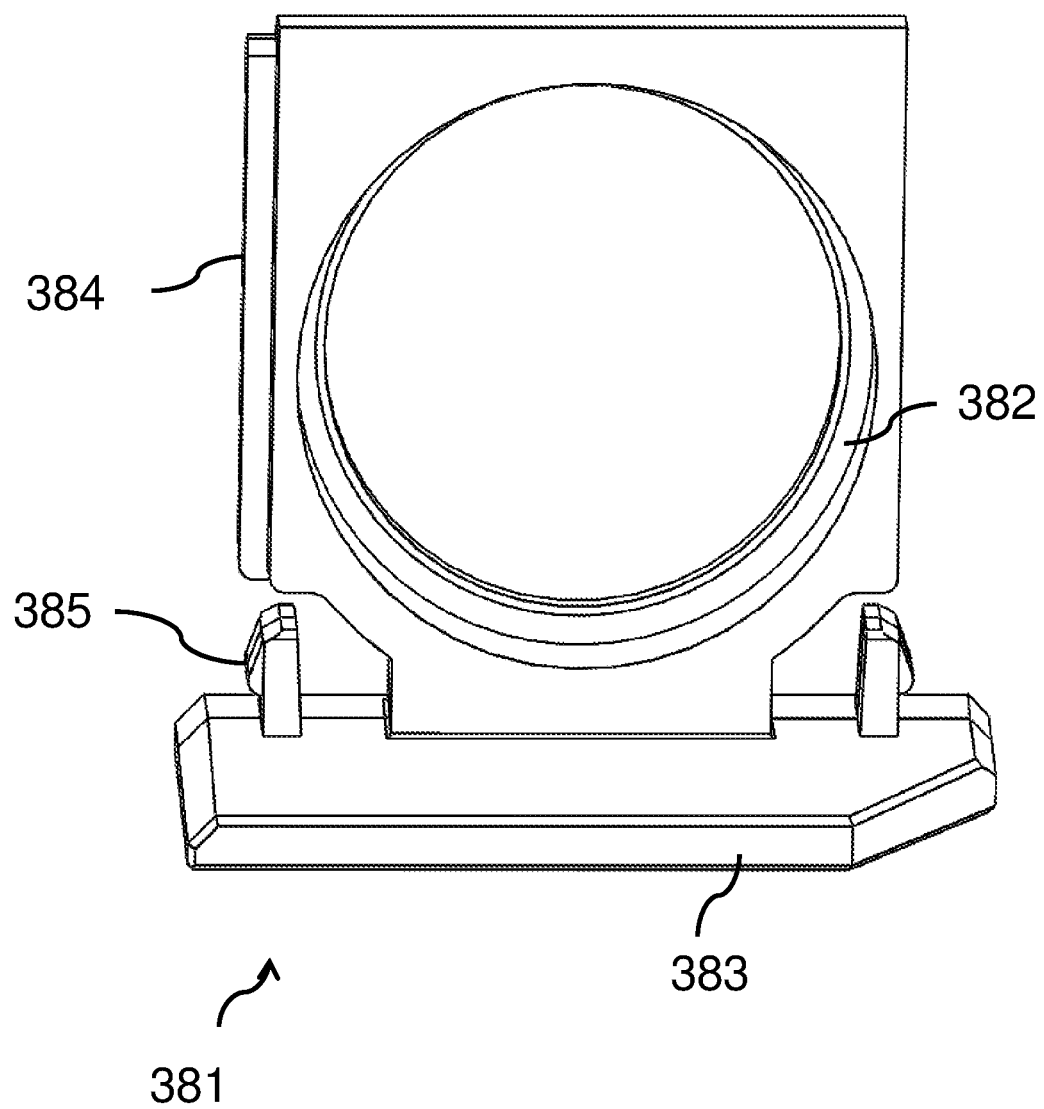
Figure 14C:
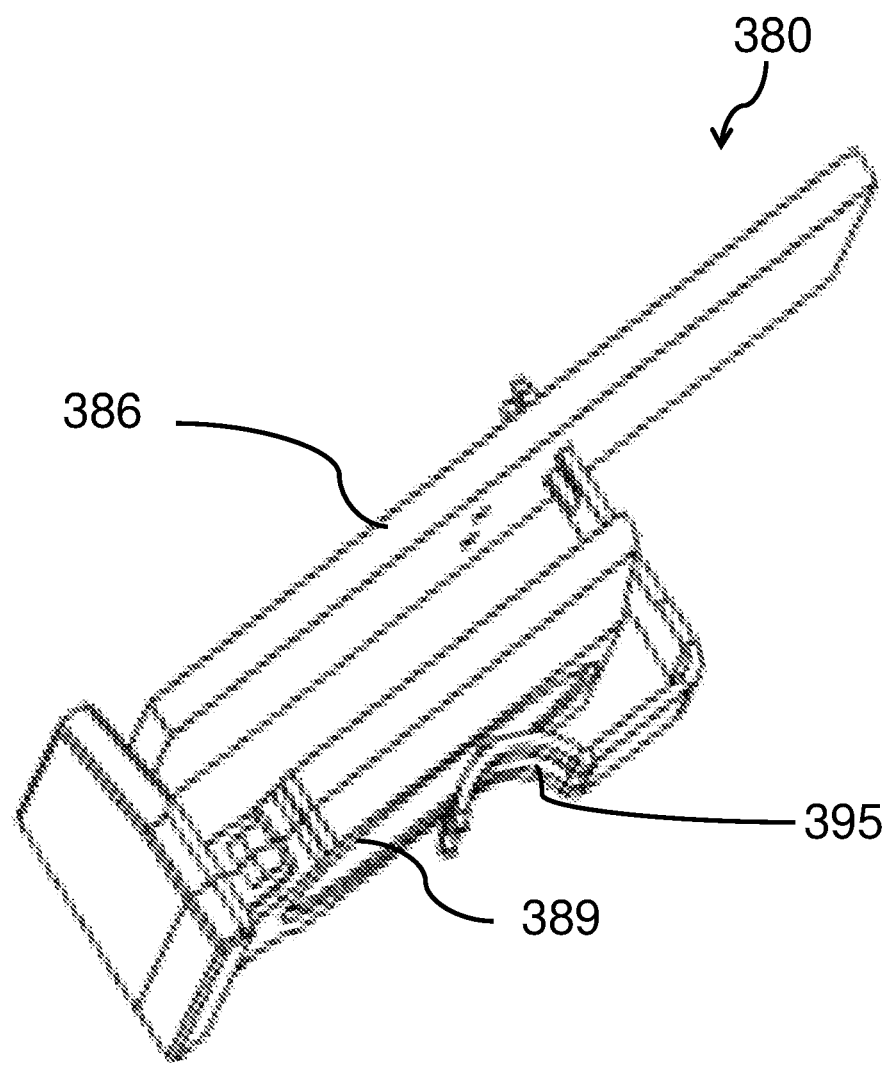

FIGS. 14A, 14B and 14C, the battery module 380 comprises a battery carrier 381 and a commensurate battery cell 389 having a first contact surface 387 and a second contact surface 388.

The battery carrier 381 has a battery seat 382, a polarized module cover 383, an optional guiding projection 384 and a plurality of click-fitting provisions 385.

Figure 15A:
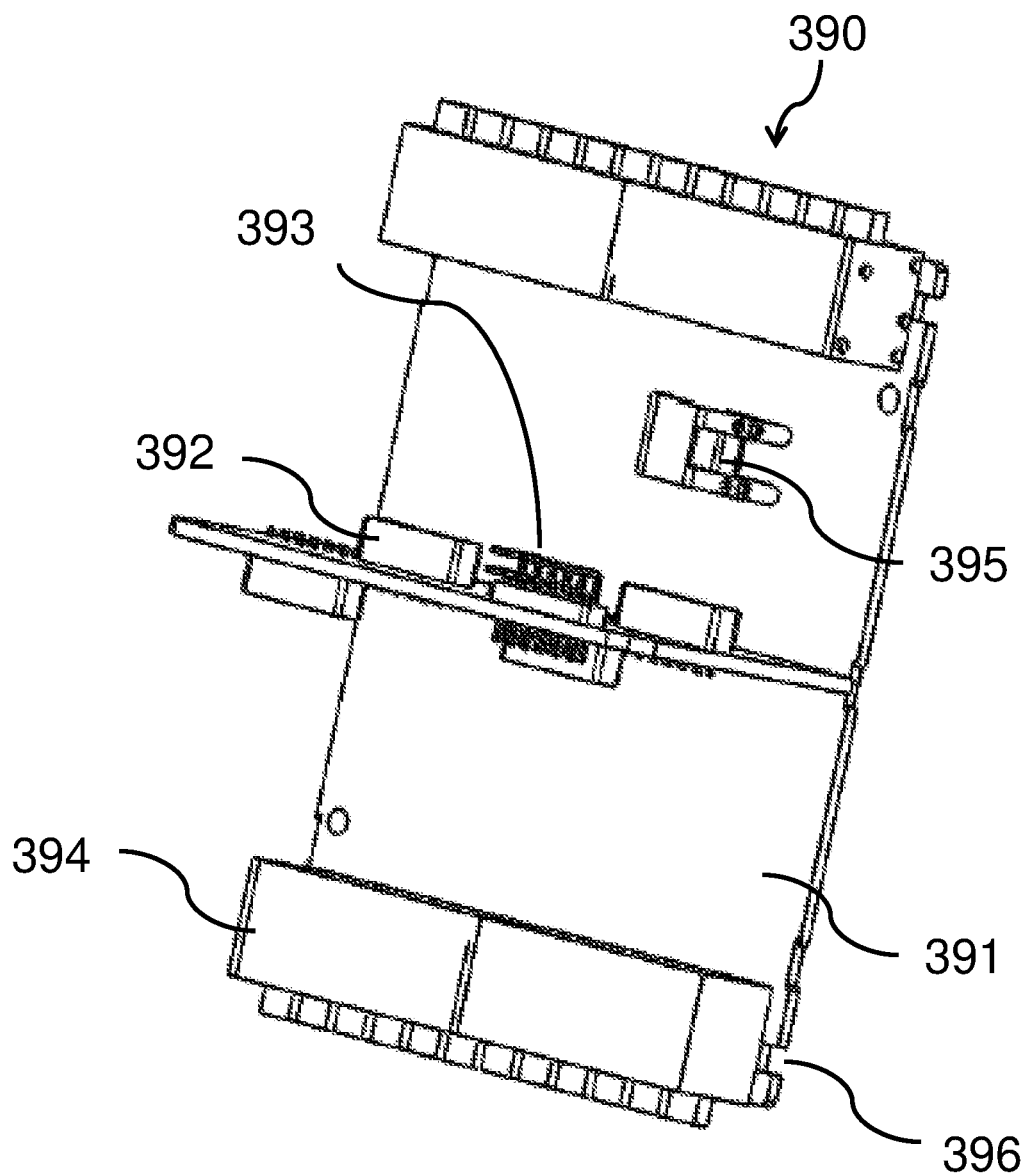

As a variation, the battery module 380 also comprises a circuit board 386 having a battery cell connector 395 with the commensurate battery cell 389 disposed in-between, and a set of plug-in male connectors, FIG. 15A, the programmable computing receptacle assembly 390 comprises a plurality of circuit boards 391 containing an embedded electronics circuitry having programmable controller, has a plurality of set of plug-in female electrical connectors 392, a set of plug-in male connectors 393, a set of wire-able connectors 394 and an optional battery cell connector 395. The programmable computing receptacle assembly 390 also has a plurality of locator constraints 396.

The process of assembling the member of electrical device of the first sub-group 11 comprises the steps of Selecting the function specific function modules 300 and the display module 350.

Inserting the programmable computing receptacle assembly 390 in the front unit 430, as permitted by the assembly constrainer 437, in the pair of major parallel tracks 432 via the major entry chamfers 435 on each track, on the inside of the left wall 433 and the right wall 434 of the front unit 430, such that the programmable computing receptacle assembly 390 rests on the plurality of resting pads 439 on the left walls 433 and the right walls 434, and the plurality of locator pad 436 of the front unit 430 match their corresponding locator constraints 396 on the programmable computing receptacle assembly 390.

Disposing the rear unit 400 on the front unit 430 in an orientation such that the left edge profile 408 and the right edge profile 409 of the rear plate 401 is matched with the left edge 472 and the right edge 473 of the front unit 430, and the sealing hole 410 of the rear plate 401 matched with the matching sealing hole 474 of the front unit 430.

Pushing the plurality of engage-able projection 407 of the rear plate 401 into the plurality of rear unit projections receiver openings 471 of the front unit 430.

Inserting the function circuit assembly 310 of the function module 300 in the pair of minor parallel tracks 452 of the functional unit receiver arrangement 451 via the minor entry chamfer 453 on each track.

Figure 15B:
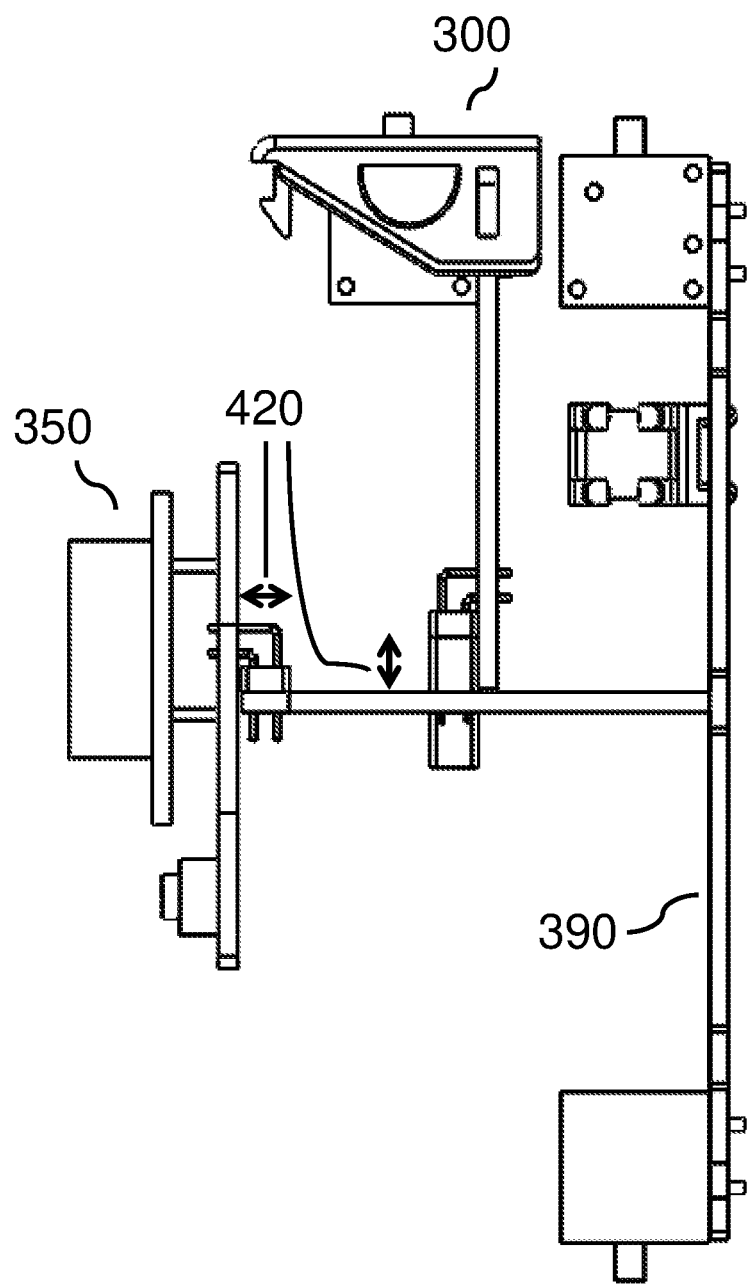
FIG. 15B is a side view of the programmable computing receptacle assembly whereon a function module and a display module is assembled.

Pushing in the fixation cap 320 till the frontal locking means 328 gets trapped in the frontal locking slot 457 on the front unit 430, and simultaneously, the constraining female projection 326 of the first bridge 325 engaging with the constraining male projections 455 of the front unit 430, and the locating female orifice 327 of the second bridge 322 engulfing the locating male projections 456 on the front unit 430; and thus ensuring that the set of plug-in male electrical connectors 312 of the function module 300 precisely engages till a defined engagement dimension 420, FIG. 15B, with a corresponding set of plug-in female electrical connector 392 on the programmable computing receptacle assembly 390.

Inserting the display module 350 via the display circuit assembly 351 of the display module 350 from the display module receiving opening 443 of the front unit 430 in an engaging orientation such that the obstructing projection 369 of the display panel 360 gets accommodated in the clear zone 444 of the peripheral wall 442 of the front unit 430.

Pushing in the display module 350 till the projection 367 of the display module engager 364 gets trapped in the locking slots 447 of the front unit 430, and at this instance the plug-in female electrical connector 353 of the display module 350 precisely engaging till a defined engagement dimension 420, FIG. 15B, with a corresponding set of plug-in male electrical connector 393 on the programmable computing receptacle assembly 390.

Inserting the battery module 380 in the longitudinal through slot 462 of the battery module receiver arrangement 461 of the front unit 430 after engaging the guiding projection 384 of the battery carrier 381 in the extension slot 463, thus ensuring that the polarized module cover 383 is aligning with the polarized seat 464.

Pushing the polarized module cover 383 of the battery carrier 381 till the click-fitting provisions 385 "click" into the click-locking slot 465; thus ensuring that the cantilever arm 438 is supporting the commensurate battery cell 389 while the first contact surface 387 and the second contact surface 388 makes an electrical contact with the battery cell connector 395 on the programmable computing receptacle assembly 390 with a requisite contact pressure.

Removing or replacing the display module 350 of the member of electrical device of the first sub-group of electrical devices 11 involves holding from the finger receptacle 366 of the display panel 360 by a thumb and a finger, or a commensurate tool, and pressing inward the flexing cantilever 365 of the display panel 360, so the projection 367 of the display module engager 364 gets free from the locking slots 447 of the front unit 430, and the display module 350 is pullable.

Removing or replacing the function module 300 involves untrapping the frontal locking means 328 of the function module 300, while simultaneously steering the function module 300 out of the front unit 430, thus also disengaging the constraining female projection 326 of the first bridge 325 from the constraining male projections 455 of the front unit 430, and the locating female orifice 327 of the second bridge 322 from the locating male projections 456 on the front unit 430.

Figure 16:
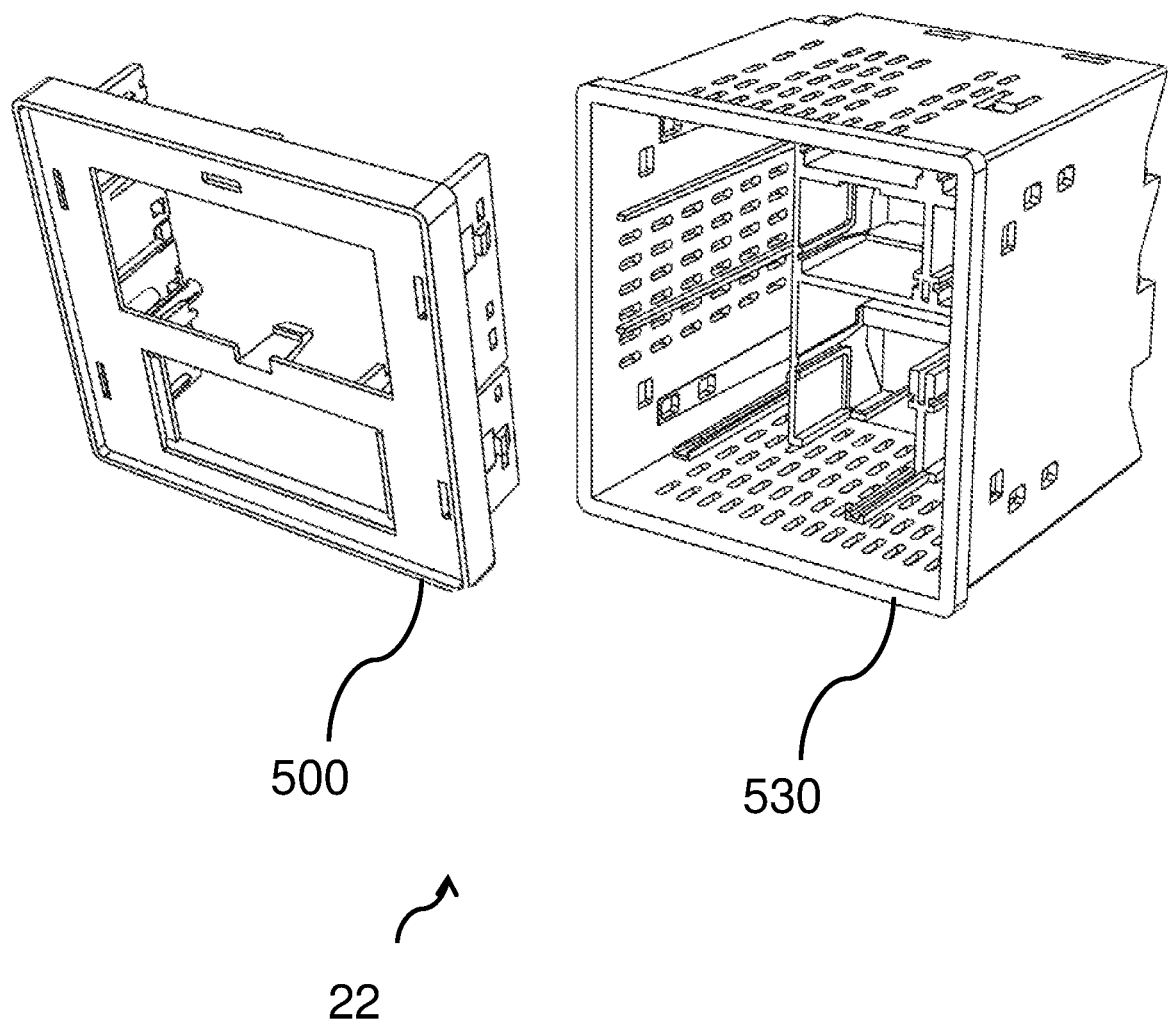
FIG. 16 is a perspective view of a bezel and a housing of a neck mountable enclosure unit.
Figure 17:
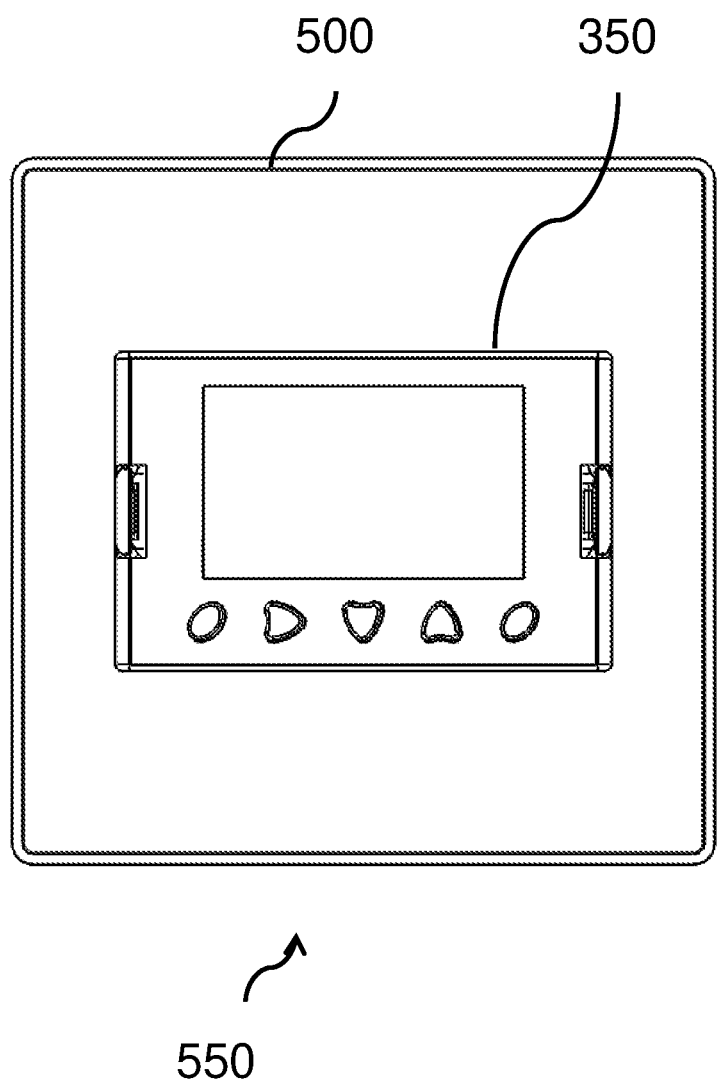
FIG. 17 is a front view of a door panel unit having a bezel and the display module.

FIG. 16, the neck mountable enclosure unit 22 of each member of electrical device of the second sub-group 12 comprises a bezel 500 and a housing 530. FIG. 17, the door panel unit 550 comprises a bezel 500 and the display module 350 disposed on the bezel 500.

Figure 18:
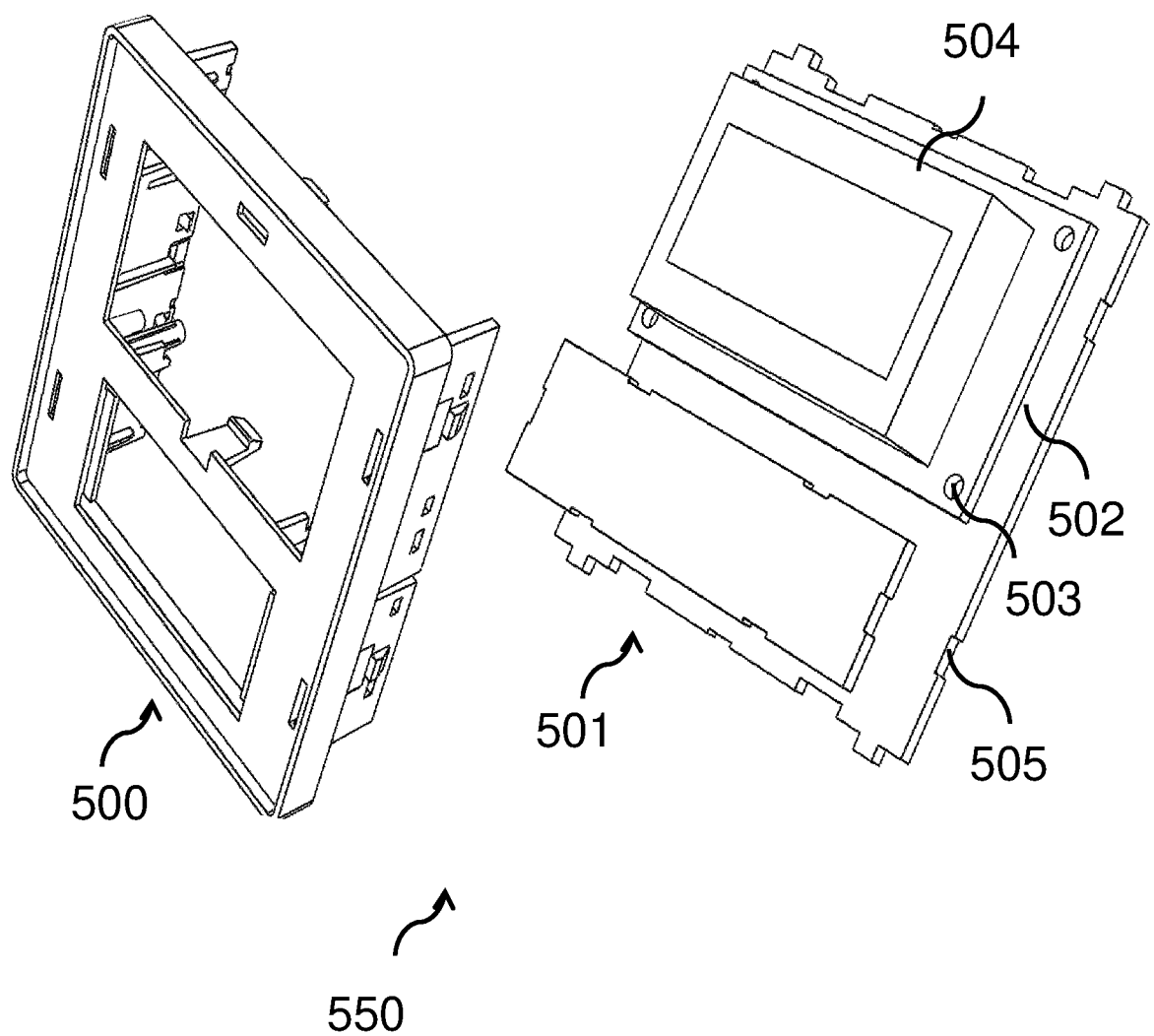
FIG. 18 is a perspective view of the bezel and a door display circuit assembly.

FIG. 18, as another embodiment, the door panel unit 550 comprises a bezel 500 and a door display circuit assembly 501 disposed on the bezel 500. A door display board 502 of the door display circuit assembly 501 has a door display specific electronic circuitry 504. The door display board 502 has a plurality of door display panel locator holes 503 and at least two door display panel engagers 505.

Figure 19:
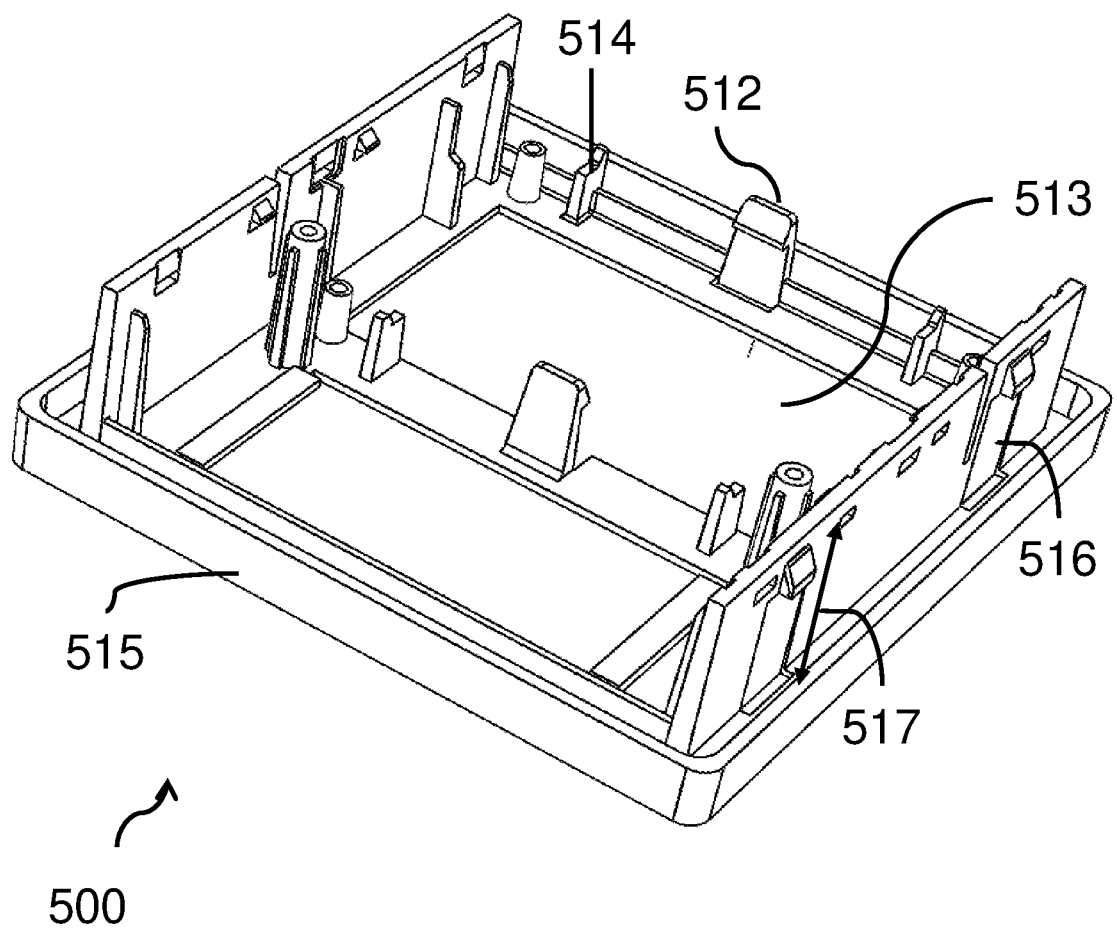
FIG. 19 is another perspective view of the bezel.

FIG. 19, the bezel 500 is made of an engineering plastic. The bezel 500 has an external frame 515, a plurality of door display assembly holding means 512 around a door display opening 513. There are provided a plurality of door display assembly seats 514. The bezel 500 has a plurality of door unit entrapment means 516. A linear dimension 517 is coordinated with a thickness of a panel door sheet whereon the neck mountable enclosure unit 22 is mounted, such that the linear dimension 517 is several times more than the thickness of the panel door sheet.

Figure 20A:
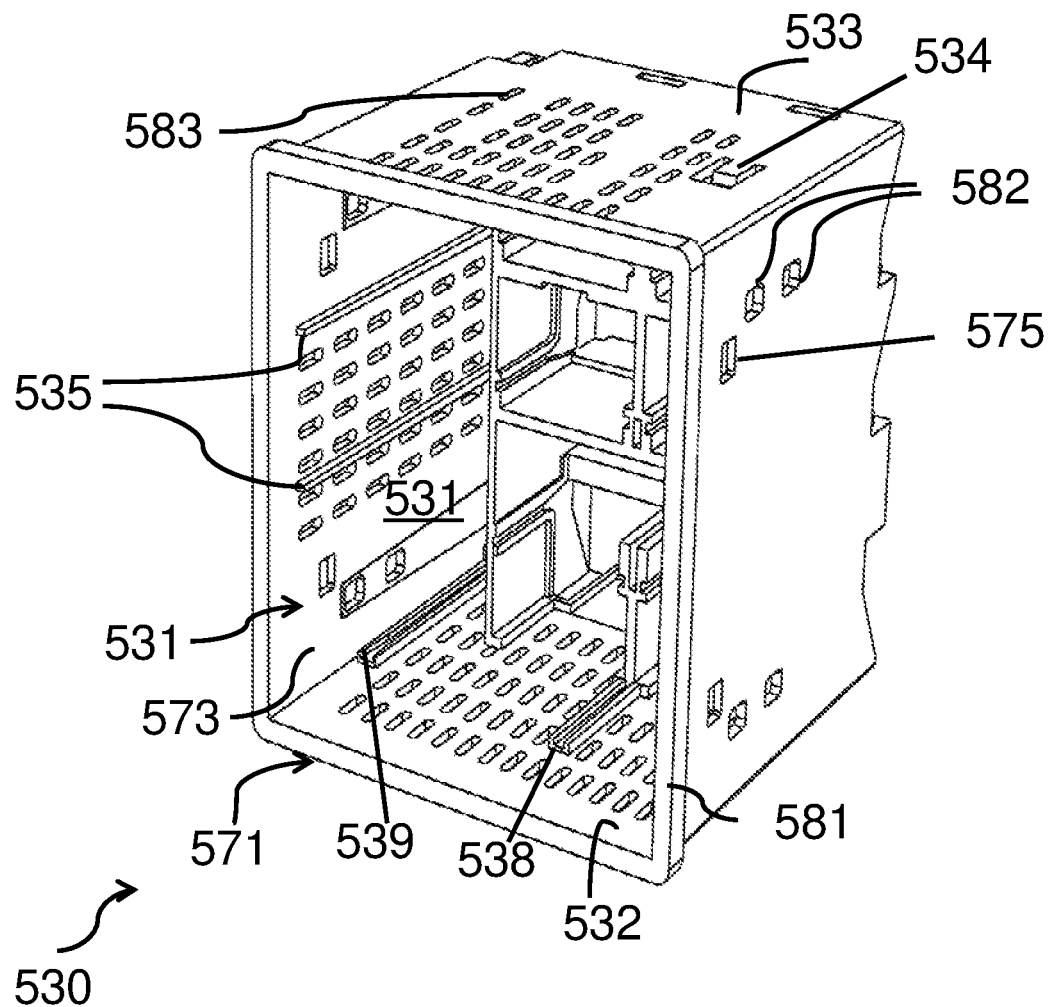
FIGS. 20A and 20B are perspective views of the housing.
Figure 20B:
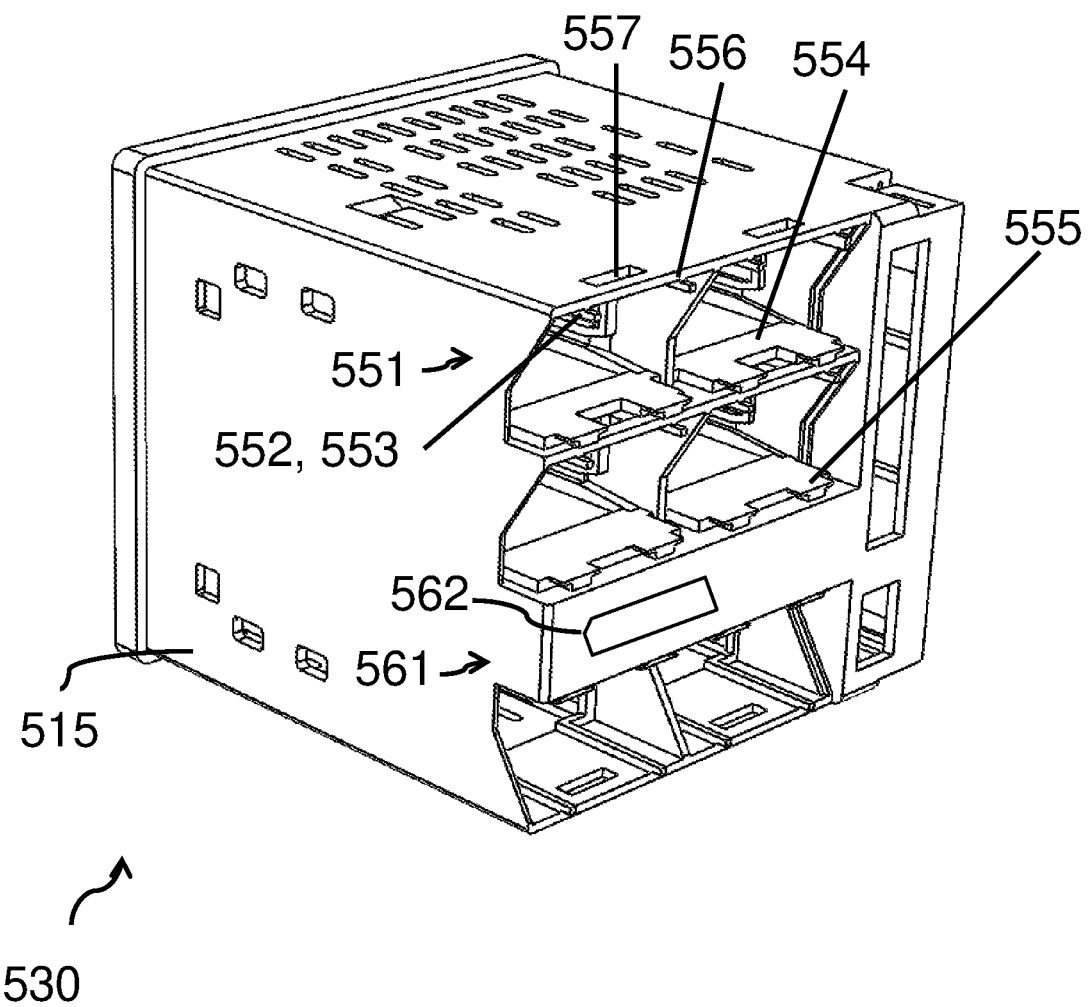

FIGS. 20A and 20B, the housing 530 is made of an engineering plastic. The housing 530 has an internal frame 581, a plurality of unit fixation means 582, a door panel unit receiver arrangement 571, a computing assembly receiver arrangement 531, a plurality of functional unit receiver arrangement 551, an optional battery module receiver arrangement 561. There is a plurality of ventilation openings 583.

In the preferred embodiment, the computing assembly receiver arrangement 531 has a pair of major parallel tracks 538 on a bottom wall 532 of the housing 530. Each major parallel track 538 has a major entry chamfer 539 on each major parallel track 538. The bottom wall 532 and a top wall 533 also have a plurality of locking clicks 534 and a plurality of stoppers 535.

The door panel unit receiver arrangement 571 has the internal frame 581 around a circuit assembly receiving opening 573, and a plurality of door panel unit receptacles 575.

The functional unit receiver arrangement 551 has a pair of minor parallel tracks 552. Each minor parallel track has a minor entry chamfer 553 on each track 552. A backward wall 554 has at least one constraining male projection 555, a corresponding frontal side of a top wall 533 or the bottom wall 532 or the backward wall 554 has at least one locating male projection 556 and at least one frontal locking slot 557.

The battery module receiver arrangement 561 has a transversal through slot 562.

The process of assembling the member of electrical device of the second sub-group of electrical devices comprises the steps of Selecting the function specific function modules 300 and the display module 350.

Inserting the programmable computing receptacle assembly 390 in the housing 530, in the pair of major parallel tracks 538 via the major entry chamfers 539 on each track, on the bottom wall 532, such that the programmable computing receptacle assembly 390 slides past the plurality of locking clicks 534 and rests on the plurality of stoppers 535.

Inserting the function circuit assembly 310 of the function module 300 in the pair of minor parallel tracks 552 of the functional unit receiver arrangement 551 via the minor entry chamfer 553 on each track.

Pushing in the fixation cap 320 till the frontal locking means 328 gets trapped in the frontal locking slot 557 of the top wall 533 or the bottom wall 532 or the backward wall 554 of the housing 530, and simultaneously, the constraining female projection 326 of the first bridge 325 engaging with the constraining male projections 555 of the corresponding backward wall 554, and the locating female orifice 327 of the second bridge 322 engulfing the locating male projections 556 on the housing 530; and thus ensuring that the set of plug-in male electrical connectors 312 of the function module 300 precisely engages till a defined engagement dimension 420 with a corresponding set of plug-in female electrical connector 392 on the programmable computing receptacle assembly 390.

Inserting the door panel unit 550 via the door display circuit assembly 501 of the door panel unit 550 from the circuit assembly receiving opening 573 of the housing 530 in an engaging orientation.

Pressing in the door panel unit 550 by seating the external frame 515 of the bezel 500 around the internal frame 581 of the housing 530, and dropping the plurality of door unit entrapment means 516 in the plurality of unit fixation means 582, and at this instance the plug-in female electrical connector 503 of the door panel unit 500 precisely engaging till a defined engagement dimension 420 with a corresponding set of plug-in male electrical connector 393 on the programmable computing receptacle assembly 390.

Inserting the battery module 380 in the transversal through slot 562 of the battery module receiver arrangement 561 of the housing 530.

Pushing the polarized module cover 383 of the battery carrier 381 till the click-fitting provisions 385 "click" into the click-locking slot of the housing 530; thus ensuring that a set of plug-in male connectors of the battery module 380 precisely engages till a defined engagement dimension 420 with a corresponding set of plug-in female electrical connectors on the programmable computing receptacle assembly 390.

Removal or replacement of the door panel unit 550 having the door display circuit assembly 501, of the member of electrical device of the second sub-group 22 is made possible only when the panel door is opened and the unit is accessible from an inside of the cubicle 19.

Figure 24:
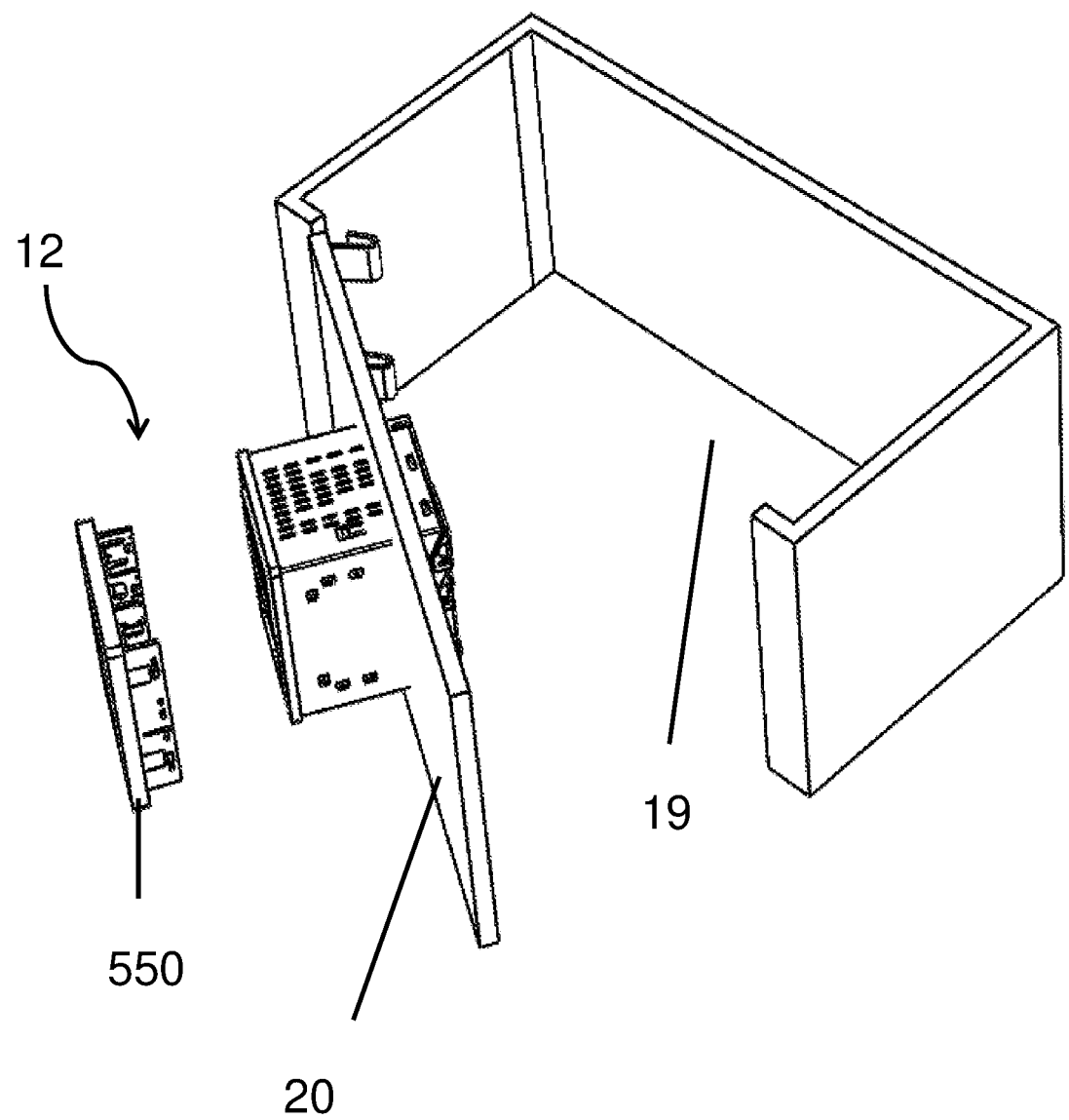
FIG. 24 is a perspective view of a cubicle having a panel door having the member of electrical device of the second sub-group mounted thereon.

FIG. 24, removing or replacing the door panel unit 550 having the door display circuit assembly 501 of the member of electrical device of the second sub-group 12 from the panel door 20 of a cubicle 19 involves removing a plurality of mounting clamps 565 (FIG. 25) from the inside of the cubicle 19, pulling out the member of the electrical device of the second sub-group 22 from a mounting window of the panel door 20, dislodging the plurality of door unit entrapment means 516 from the plurality of unit fixation means 582, and holding out the external frame 515 of the bezel 500 from around the internal frame 581 of the housing 530.

Removing or replacing the function module 300 involves an untrapping of the frontal locking means 328 of the function module 300, while simultaneously steering the function module 300 out of the housing 530, thus also disengaging the constraining female projection 326 of the first bridge 325 from the constraining male projections 555 of the housing 530, and the locating female orifice 327 of the second bridge 322 from the locating male projections 556 on the housing 530.

The untrapping of the frontal locking means 328 is by a fine edge screw driver or an equivalent sharp tool.

Figure 21:
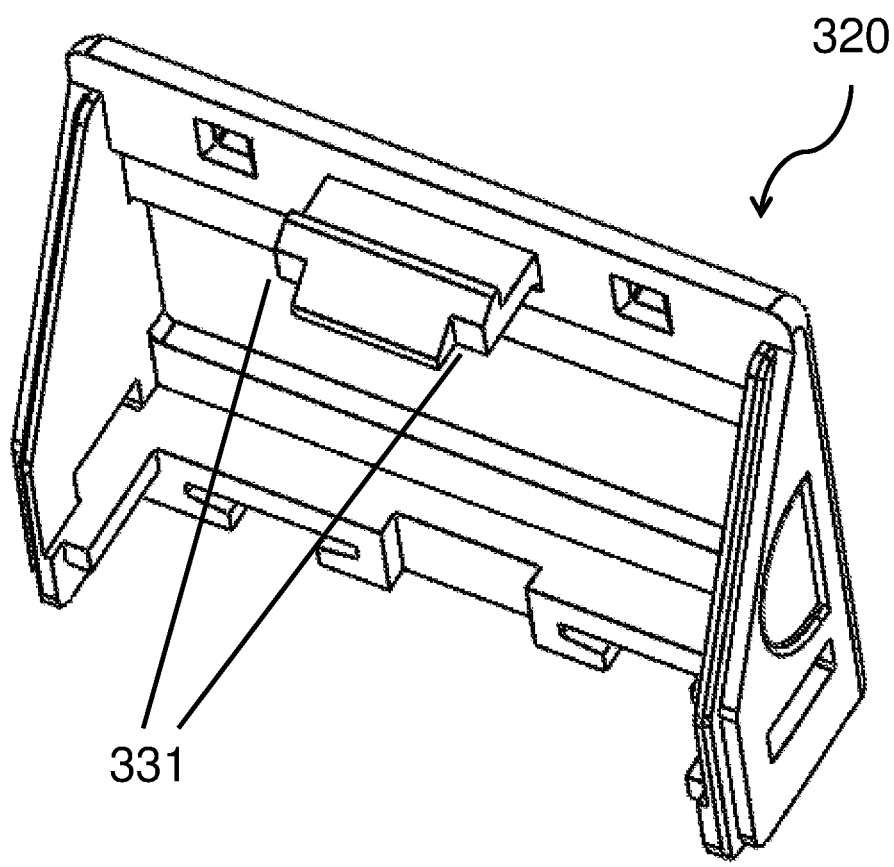
FIG. 21 is another embodiment of the fixation cap.
Figure 22:
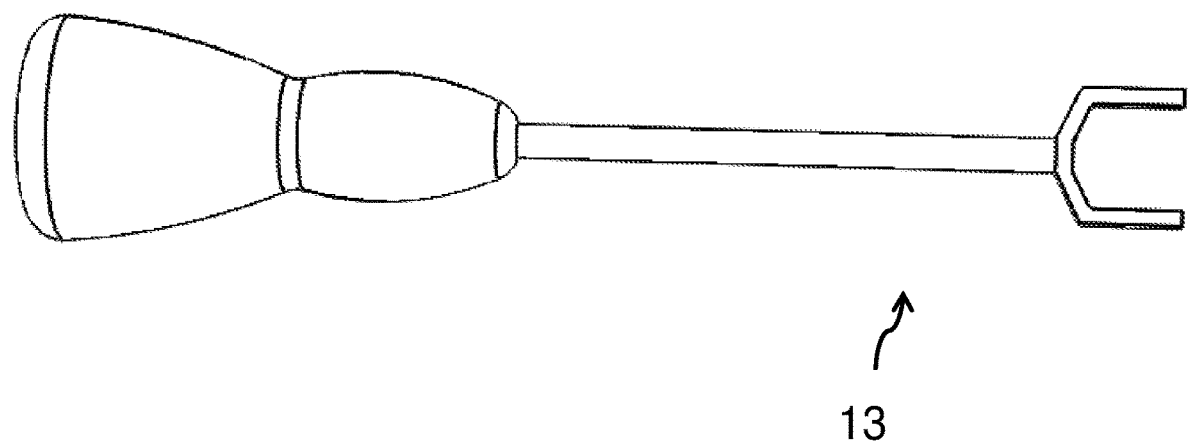
FIG. 22 is a side view of a fork type screw driver.
Figure 23:
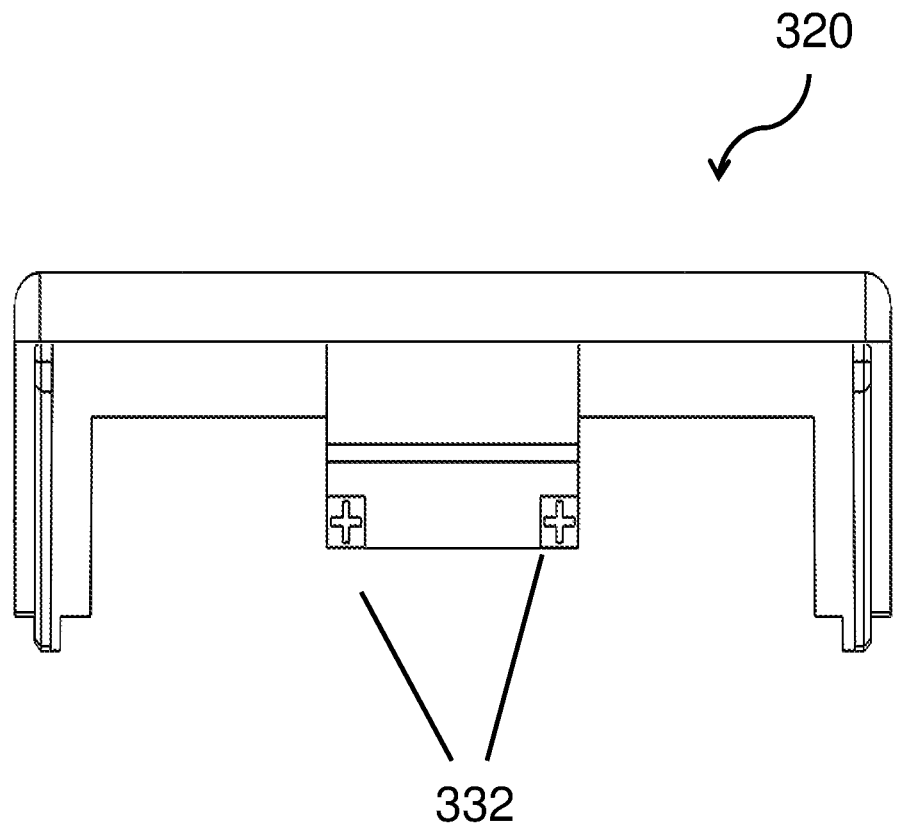
FIG. 23 is yet another embodiment of the fixation cap.

For situations where the removing or replacing the function module 300 is a supervisory function, FIG. 21 describes another embodiment wherein the fixation cap 320 has a pair of safety slots 331, and the untrapping is by a fork type screw driver 13, FIG. 22. FIG. 23 describes yet another embodiment, wherein the untrapping is by a fork type tool with an untrapping profile complementary to a safety profile 332 provided on the fixation cap 320 of the function module 300.

Figure 25:
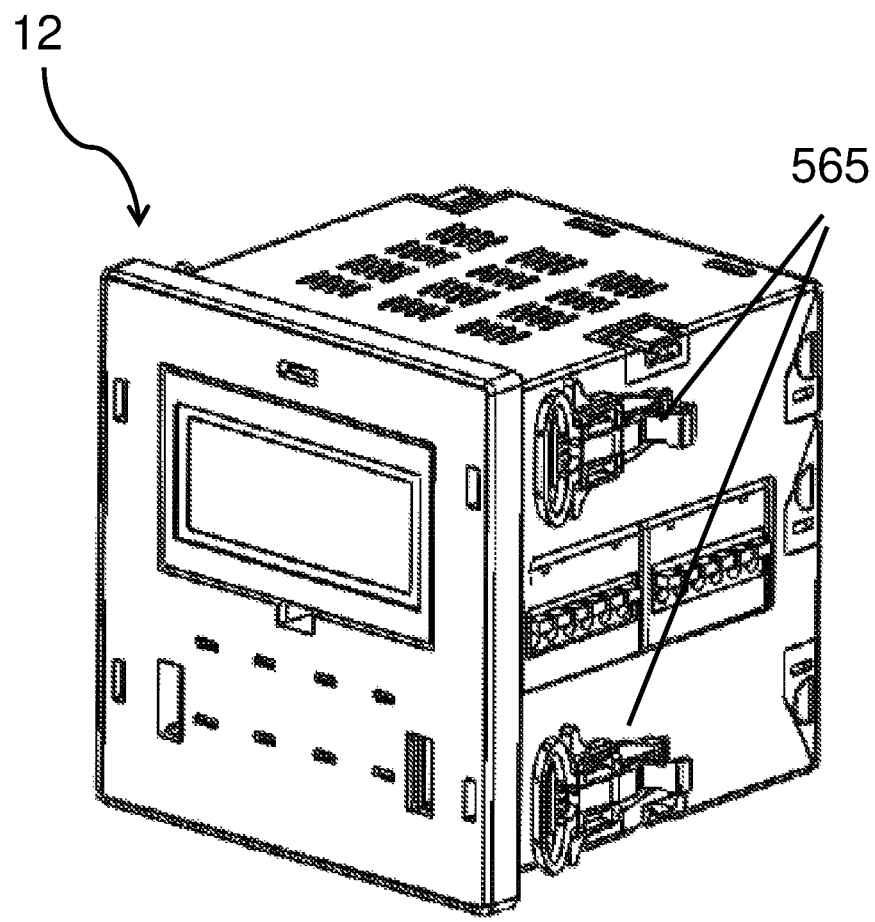
FIG. 25 is a perspective view of another embodiment of one of the members of the second sub-group.
Figure 26:
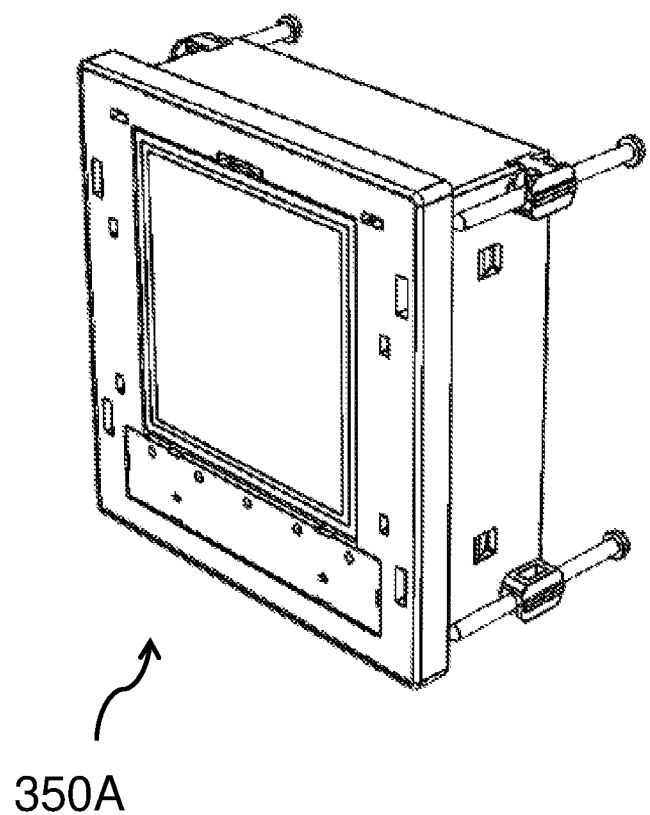
FIG. 26 is a perspective view of an add-on display module.
Figure 27A:
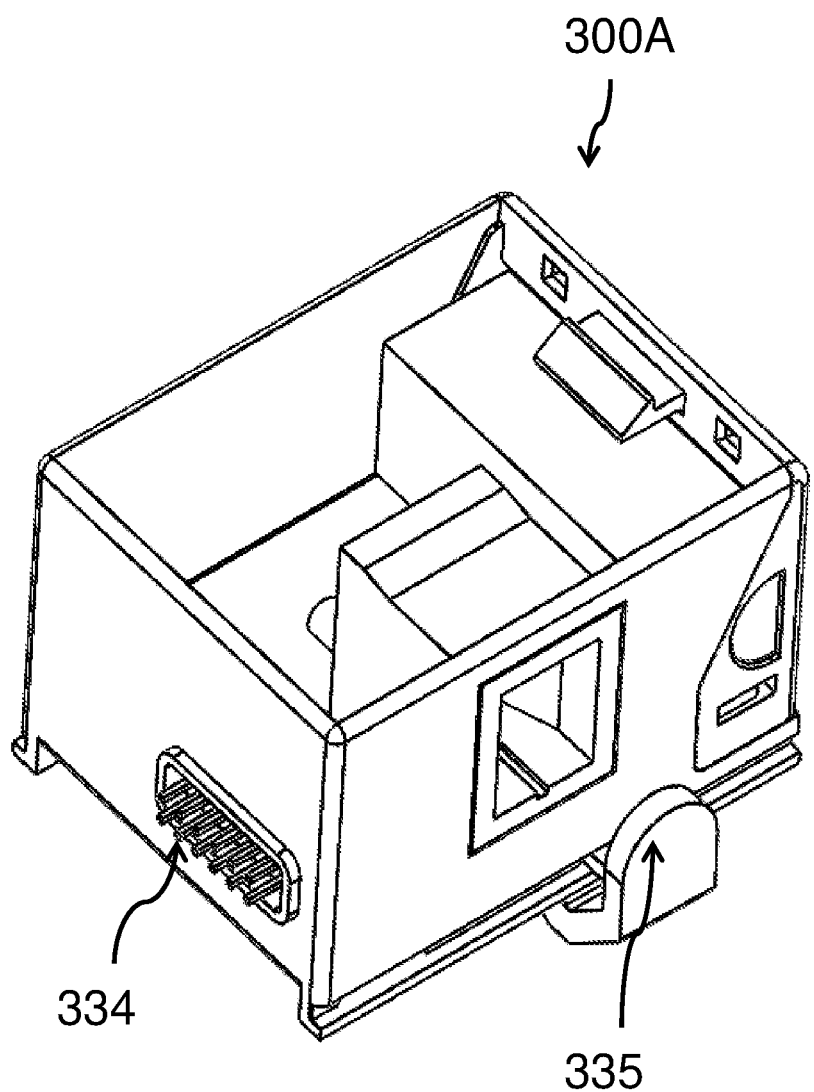
Figure 27B:
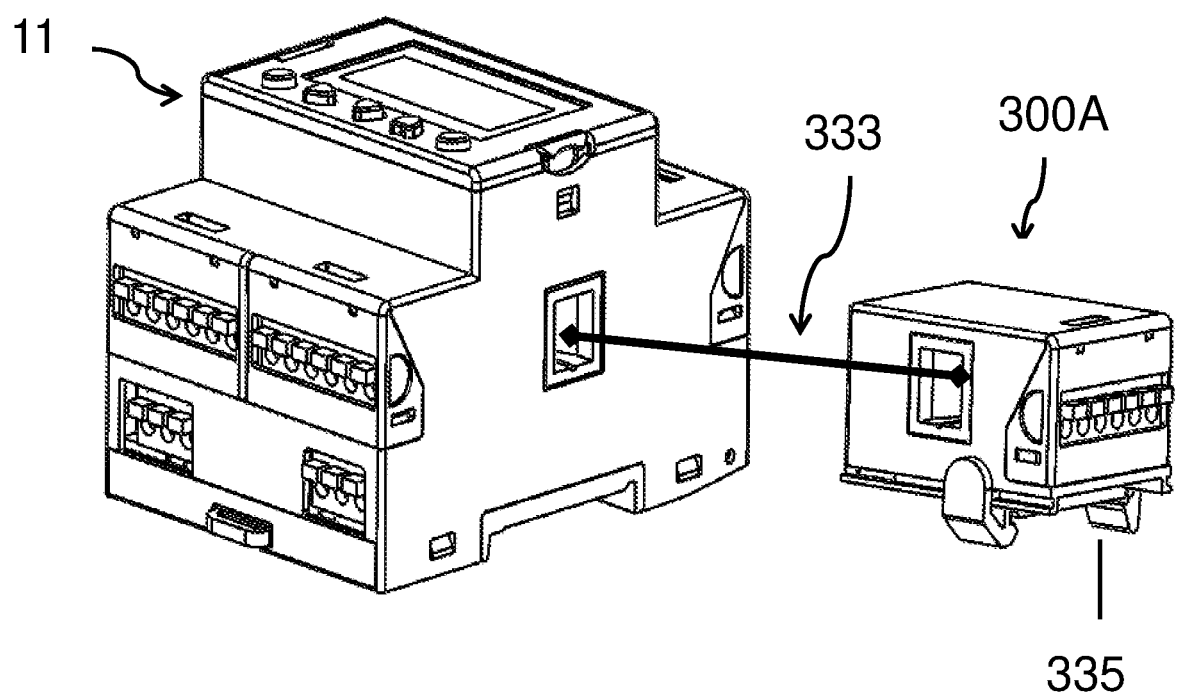
FIG. 27B is a perspective view of the add-on function module electrically connected to the member of the electrical device of the second sub-group.

FIG. 25, the function module 300 is mounted within the neck mountable enclosure unit 22 as another variation, As yet another variation, the function module 300 and the display module 350 are mountable outside the base mountable enclosure unit 21 and the neck mountable enclosure unit 22. FIG. 26 is one such add-on display module 350A, while FIG. 27A is one such function module 300A. FIG. 27B the function module 300 is an add-on function module 300A mounted outside a base mountable enclosure unit 21. The add-on function module 300A is with a base mounting arrangement 335, preferably suitable for a DIN rail, or mountable on and around the base mountable enclosure unit 21 or mountable on and around the neck mountable enclosure unit 22. The add-on function module 300A is electrically connected either through a communication link 333 or through a plug-on arrangement 334. The present invention has innumerable such possibilities.

Since there are several function unit receiver arrangements 451 in members of the first sub-group 11 and the second sub-group 12, any unused functional unit receiver arrangements 451 are plugged with a dummy fixation cap.

Figure 28:
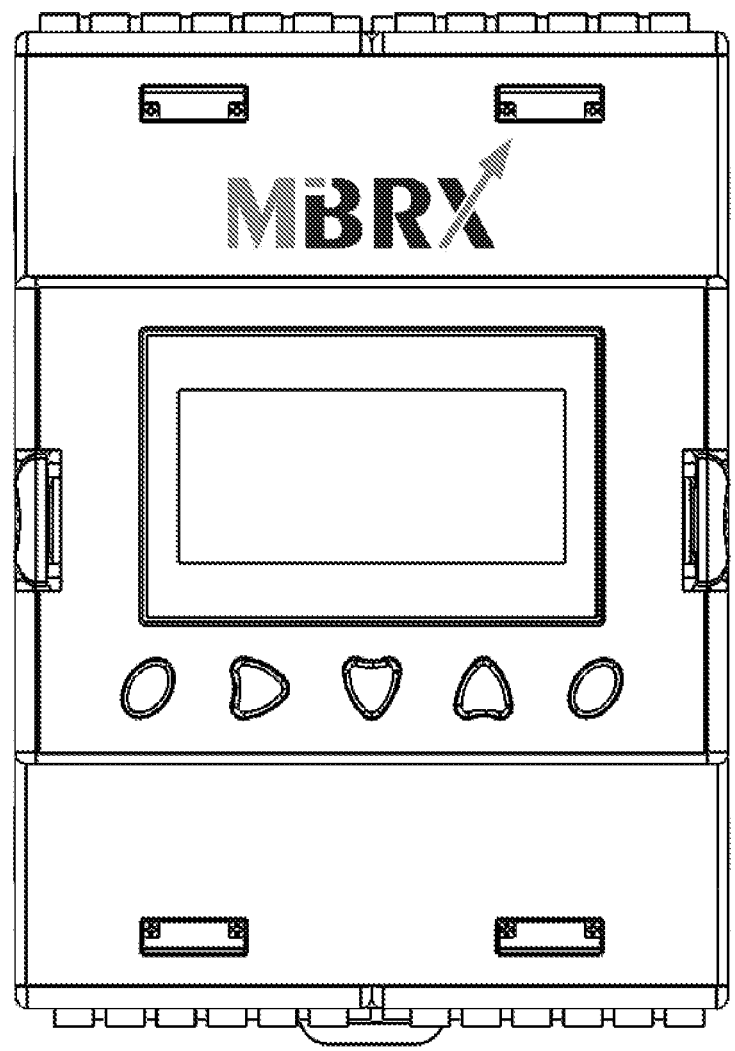
FIG. 28 is a front view of a member of the electric device of the first sub-group.

FIG. 28, the modular and configurable electrical device group as per present invention is branded as

MBRX

I claim:

1. A group of electrical devices for measurement, control and display of electrical and process parameters comprising a first sub-group and a second sub-group, each member of electrical device of the first sub-group comprises a base mountable enclosure unit, a programmable computing receptacle assembly and a plurality of function modules;

each member of electrical device of the second sub-group comprises a neck mountable enclosure unit, the programmable computing receptacle assembly and the plurality of function modules; and each member of the group of electrical devices has a display module and optionally a battery module;

wherein the base mountable enclosure unit of each member of electrical device of the first sub-group comprises:
a rear unit having a rear plate and a locking frame having a cantilevered pin; and
a front unit having a computing assembly receiver arrangement, a display module receiver arrangement, a plurality of functional unit receiver arrangement, at least a battery module receiver arrangement; and wherein the neck mountable enclosure unit of each member of electrical device of the second sub-group comprises:
a door panel unit having a bezel and a door display circuit assembly disposed on the bezel; and and a housing having an internal frame, a plurality of unit fixation means, a door panel unit receiver arrangement, a computing assembly receiver arrangement, a plurality of functional unit receiver arrangement, an optional battery module receiver arrangement, a plurality of ventilation openings.

2. The group of electrical devices as claimed in claim 1, wherein the function module has a fixation cap having a pair of safety slots.

3. The group of electrical devices as claimed in claim 1, wherein the function module has a fixation cap having a pair of safety profile.

4. The group of electrical devices as claimed in claim 1, wherein the function module is an add-on function module.

5. The group of electrical devices as claimed in claim 4, wherein the add-on function module is with a base mounting arrangement.

6. The group of electrical devices as claimed in claim 4, wherein the add-on function module is mountable on and around the base mountable enclosure unit.

7. The group of electrical devices as claimed in claim 4, wherein the add-on function module is mountable on and around the neck mountable enclosure unit.

8. The group of electrical devices as claimed in claim 4, wherein the add-on function module is electrically connected through a communication link.

9. The group of electrical devices as claimed in claim 4, wherein the add-on function module is electrically connected through a plug-on arrangement.

10. The group of electrical devices as claimed in claim 1, wherein the display module is an add-on display module.

11. A process of preparing a group of electrical devices for measurement, control and display of electrical and process parameters comprising a first sub-group of electrical devices, each member of electrical device of the first sub-group comprises a base mountable enclosure unit, a first programmable computing receptacle assembly and a plurality of function modules, the process comprises the steps of:
  Selecting a plurality of function specific function modules and a display module,
  Inserting the programmable computing receptacle assembly in a front unit, as permitted by an assembly constrainer on a front unit, in a pair of major parallel tracks via a major entry chamfers on each track, on an inside of a left wall and a right wall of the front unit,
  Resting the programmable computing receptacle assembly on a plurality of resting pads on the left walls and the right walls, and a plurality of locator pad of the front unit matching their corresponding locator constraints on the programmable computing receptacle assembly,
  Disposing a rear unit on the front unit in an orientation such that a left edge profile and a right edge profile of a rear plate is matching with a left edge and a right edge of the front unit, and a sealing hole of the rear plate coinciding with a matching sealing hole of the front unit,
  Pushing a plurality of engage-able projection of the rear plate into a plurality of rear unit projections receiver openings of the front unit,
  Inserting a function circuit assembly of the function module in a pair of minor parallel tracks of a functional unit receiver arrangement via a minor entry chamfer on each track, of the front unit,
  Pushing in a fixation cap till a frontal locking means gets trapped in a frontal locking slot on the front unit, and simultaneously, a constraining female projection of a first bridge engaging with a constraining male projections of the front unit, and a locating female orifice of a second bridge engulfing a locating male projections on the front unit; and thus ensuring that a set of plug-in male electrical connectors of the function module precisely engaging till a defined engagement dimension with a corresponding set of plug-in female electrical connector on the programmable computing receptacle assembly,
  Inserting the display module via a display circuit assembly of the display module from a display module receiving opening of the front unit in an engaging orientation such that an obstructing projection of a display panel getting accommodated in a clear zone of a peripheral wall of the front unit,
  Pushing in the display module till a projection of a display module engager getting trapped in a locking slots of the front unit, and at this instance a plug-in female electrical connector of the display module precisely engaging till a defined engagement dimension with a corresponding set of plug-in male electrical connector on the programmable computing receptacle assembly,
  Inserting a battery module in a longitudinal through slot of the battery module receiver arrangement of the front unit after engaging a guiding projection of a battery carrier in an extension slot, thus ensuring that a polarized module cover is aligning with a polarized seat,
  Pushing the polarized module cover of the battery carrier till a click-fitting provisions "click" into a click-locking slot; thus ensuring that a cantilever arm is supporting a commensurate battery cell while a first contact surface and a second contact surface making an electrical contact with a battery cell connector on the programmable computing receptacle assembly with a requisite contact pressure.

12. The process of preparing a group of electrical devices as claimed in claim 11, wherein the preparing process of removing or replacing the display module comprises the steps of holding from the finger receptacle of the display panel by a thumb and a finger, or a commensurate tool, and pressing inward the flexing cantilever of the display panel, so the projection of the display module engager getting free from the locking slots of the front unit, enabling the pulability of the display module.

13. The process of preparing a group of electrical devices as claimed in claim 11, wherein the preparing process of removing or replacing the function module comprises the steps of untrapping the frontal locking means of the function module, while simultaneously steering the function module out of the front unit, thus also disengaging the constraining female projection of the first bridge from the constraining male projections of the front unit, and the locating female orifice of the second bridge from the locating male projections on the front unit.

14. A process of preparing a group of electrical devices for measurement, control and display of electrical and process parameters comprising a second sub-group of electrical devices, each member of electrical device of the second sub-group comprises a neck mountable enclosure unit, a programmable computing receptacle assembly and a plurality of function modules, the process comprises the steps of:
  Selecting a plurality of function specific function modules and a display module,
  Inserting a programmable computing receptacle assembly in a housing, in a pair of major parallel tracks via a major entry chamfers on each track, on a bottom wall, sliding the programmable computing receptacle assembly past a plurality of locking clicks and resting on a plurality of stoppers, Inserting a function circuit assembly of the function module in a pair of minor parallel tracks of a functional unit receiver arrangement via a minor entry chamfer on each track, Pushing in a fixation cap till a frontal locking means gets trapped in a frontal locking slot of a top wall or a bottom wall or a backward wall of the housing, and simultaneously, a constraining female projection of a first bridge engaging with a constraining male projections of a corresponding backward wall, and a locating female orifice of a second bridge engulfing a locating male projections on the housing; and thus ensuring that a set of plug-in male electrical connectors of the function module precisely engages till a defined engagement dimension with a corresponding set of plug-in female electrical connector on the programmable computing receptacle assembly, Inserting a door panel unit via a door display circuit assembly of the door panel unit from a circuit assembly receiving opening of the housing in an engaging orientation, Pressing in the door panel unit by seating an external frame of a bezel around an internal frame of the housing, and dropping a plurality of door unit entrapment means in a plurality of unit fixation means, and at this instance a set of plug-in female electrical connector of the door panel unit precisely engaging till a defined engagement dimension with a corresponding set of plug-in male electrical connector on the programmable computing receptacle assembly, Inserting a battery module in a transversal through slot of a battery module receiver arrangement of the housing, Pushing a polarized module cover of a battery carrier till a click-fitting provisions "click" into a click-locking slot of the housing; thus ensuring that a set of plug-in male connectors of the battery module precisely engages till a defined engagement dimension with a corresponding set of plug-in female electrical connectors on the programmable computing receptacle assembly.

15. The process of preparing a group of electrical devices as claimed in claim 14, wherein the preparing process of removing or replacing the door panel unit having the door display circuit assembly of the member of electrical device of the second sub-group from the panel door comprises the steps of:

Removing a plurality of mounting clamps from the inside of a cubicle,

Pulling out the member of the electrical device of the second sub-group from a mounting window of the panel door, Dislodging the plurality of door unit entrapment means from the plurality of unit fixation means, Holding out the external frame of the bezel from around the internal frame of the housing.

16. The process of preparing a group of electrical devices as claimed in claim 14, wherein the preparing process of removing or replacing the function module involves an untrapping of the frontal locking means of the function module, while simultaneously steering the function module out of the housing, thus also disengaging the constraining female projection of the first bridge from the constraining male projections of the housing, and the locating female orifice of the second bridge from the locating male projections on the housing.

17. The process of preparing a group of electrical devices as claimed in claim 11 or 14, wherein the untrapping is by a fork type screw driver.

18. The process of preparing a group of electrical devices as claimed in claim 11 or 14, wherein the untrapping is by a fork type tool with an untrapping profile complementary to a safety profile provided on a fixation cap of the function module.

* * * * *